United States Patent
Sawaguchi et al.

(10) Patent No.: US 11,664,778 B2
(45) Date of Patent: May 30, 2023

(54) BAND-PASS FILTER

(71) Applicant: TDK CORPORATION, Tokyo (JP)

(72) Inventors: Shuhei Sawaguchi, Tokyo (JP); Yuta Ashida, Tokyo (JP); Masahiro Tatematsu, Tokyo (JP); Yoshinori Matsumaru, Tokyo (JP); Shigemitsu Tomaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/902,256

(22) Filed: Sep. 2, 2022

(65) Prior Publication Data

US 2022/0416754 A1   Dec. 29, 2022

Related U.S. Application Data

(63) Continuation of application No. 17/242,053, filed on Apr. 27, 2021, now Pat. No. 11,476,822.

(30) Foreign Application Priority Data

Apr. 30, 2020  (JP) .............................. JP2020-080413

(51) Int. Cl.
| | | |
|---|---|---|
| *H03H 7/42* | (2006.01) | |
| *H03H 7/01* | (2006.01) | |
| *H03H 7/09* | (2006.01) | |
| *H03H 1/00* | (2006.01) | |

(52) U.S. Cl.
CPC ............ *H03H 7/42* (2013.01); *H03H 7/0115* (2013.01); *H03H 7/0161* (2013.01); *H03H 7/09* (2013.01); *H03H 2001/0085* (2013.01)

(58) Field of Classification Search
CPC ......... H03H 2001/0085; H03H 7/0115; H03H 7/42; H03H 7/09; H01P 5/10
USPC ......................................... 333/175, 177, 185
See application file for complete search history.

(56) References Cited

U.S. PATENT DOCUMENTS

| | | | |
|---|---|---|---|
| 6,433,653 B1 | 8/2002 | Matsumura et al. | |
| 7,432,786 B2* | 10/2008 | Tomaki | H01P 1/20345 333/204 |
| 7,463,120 B2* | 12/2008 | Matsubara | H01P 1/20345 333/204 |

(Continued)

FOREIGN PATENT DOCUMENTS

| | | |
|---|---|---|
| CN | 1288288 A | 3/2001 |
| CN | 1495963 A | 5/2004 |

(Continued)

OTHER PUBLICATIONS

English Translation of Office Action dated Dec. 29, 2021 in Chinese Application No. 202110480880.7.

*Primary Examiner* — Rakesh B Patel
(74) *Attorney, Agent, or Firm* — Oliff PLC

(57) ABSTRACT

A band-pass filter includes an unbalanced port, a first balanced port, a second balanced port, and first to third resonators provided between the unbalanced port and the first and second balanced ports. The second resonator and the third resonator each are a resonator with both ends open. The second resonator and the third resonator are adjacent to each other in a circuit configuration, and electromagnetically coupled by magnetic coupling as main coupling. The first resonator is provided closer to the second resonator than to the third resonator, and jump-coupled to the third resonator.

13 Claims, 30 Drawing Sheets

(56) References Cited

U.S. PATENT DOCUMENTS

| | | |
|---|---|---|
| 2004/0095212 A1 | 5/2004 | Iwasaki et al. |
| 2006/0022773 A1 | 2/2006 | Iwasaki et al. |
| 2009/0079516 A1 | 3/2009 | Miyata et al. |
| 2012/0049977 A1 | 3/2012 | Chuang |

FOREIGN PATENT DOCUMENTS

| | | |
|---|---|---|
| JP | 2002-374139 A | 12/2002 |
| JP | 2007-267264 A | 10/2007 |

* cited by examiner

BAND-PASS FILTER

CROSS REFERENCE TO RELATED APPLICATION

This application is a continuation of U.S. application Ser. No. 17/242,053, filed Apr. 27, 2021, the contents of which are incorporated herein by reference.

BACKGROUND OF THE INVENTION

1. Field of the Invention

The present invention relates to a balanced band-pass filter that includes an unbalanced port and a pair of balanced ports.

2. Description of the Related Art

As a kind of electronic components that can be used in transmission and reception circuits of wireless communication devices such as cellular phones or wireless LAN communication devices, there are band-pass filters each including a plurality of resonators. The band-pass filter preferably has an attenuation pole at which insertion loss abruptly varies in each of a first vicinity range and a second vicinity range. The first vicinity range is a frequency range lower than a pass band and in the vicinity of the pass band. The second vicinity range is a frequency range higher than the pass band and in the vicinity of the pass band.

As the band-pass filters, balanced band-pass filters each including a pair of balanced ports as output ports are known. The balanced band-pass filter is required to have a good amplitude balance characteristic and a good phase balance characteristic. The good amplitude balance characteristic means that two balanced element signals that constitute a balanced signal outputted from the band-pass filter have an amplitude difference of approximately zero. The good phase balance characteristic means that the two balanced element signals have a phase difference of approximately 180 degrees.

JP 2002-374139 A discloses a balanced LC filter including a pair of balanced input terminals and a pair of balanced output terminals. In the balanced LC filter, an attenuation pole is provided on a lower frequency side or a higher frequency side than a center frequency of the balanced LC filter using pole adjustment capacitors.

JP 2007-267264 A discloses a lumped constant bandpass filter including a pair of balanced terminals and an unbalanced terminal. JP 2007-267264 A describes that an unbalanced-input-and-balanced-output filter is configured by using the unbalanced terminal as an input terminal and using the pair of balanced terminals as output terminals.

Mobile communication systems up to the fourth generation are put to practical use at present. Standardization of fifth-generation mobile communication systems is now underway. In these mobile communication systems, it has been difficult for conventional balanced band-pass filters to form an abrupt attenuation pole in each of the foregoing first and second vicinity ranges while satisfying the balance characteristics.

SUMMARY OF THE INVENTION

An object of the present invention is to provide a balanced band-pass filter, including an unbalanced port and a pair of balanced ports, that can form an abrupt attenuation pole while satisfying a balance characteristic.

A band-pass filter according to the present invention includes an unbalanced port, a first balanced port, a second balanced port, and first to third resonators provided between the unbalanced port and the first and second balanced ports in a circuit configuration. The second resonator and the third resonator each are a resonator with both ends open. The second resonator and the third resonator are adjacent to each other in the circuit configuration, and electromagnetically coupled by magnetic coupling as main coupling. The first resonator is provided closer to the second resonator than to the third resonator in the circuit configuration, and jump-coupled to the third resonator.

In the band-pass filter according to the present invention, the first resonator may be a resonator with one end shorted, and provided between the unbalanced port and the second resonator in the circuit configuration.

In the band-pass filter according to the present invention, a distance between the second resonator and the third resonator may be shorter than a distance between the first resonator and the second resonator.

The band-pass filter according to the present invention may further include a fourth resonator provided between the unbalanced port and the first and second balanced ports in the circuit configuration. In this case, the fourth resonator may be provided closer to the third resonator than to the second resonator in the circuit configuration, and jump-coupled to the second resonator. In this case, the first resonator may be a resonator with one end shorted, and provided between the unbalanced port and the second resonator in the circuit configuration. The fourth resonator may be a resonator with both ends open, and provided between the first and second balanced ports and the third resonator in the circuit configuration.

If the band-pass filter according to the present invention is provided with the fourth resonator, the distance between the second resonator and the third resonator may be shorter than that between the first resonator and the second resonator, and shorter than that between the third resonator and the fourth resonator.

The band-pass filter according to the present invention may further include a stack to integrate at least the second and third resonators. The stack may include a plurality of stacked dielectric layers, a plurality of stacked conductor layers, and a plurality of through holes. In such a case, the plurality of conductor layers may include a plurality of resonator-forming conductor layers. The plurality of through holes may include a plurality of resonator-forming through holes. Each of the second and third resonators may include a first through hole line, a second through hole line, and a conductor layer portion. Each of the first and second through hole lines may be formed of serially connected two or more through holes of the plurality of resonator-forming through holes, and may penetrate two or more dielectric layers of the plurality of dielectric layers. The conductor layer portion may be formed of one or more resonator-forming conductor layers of the plurality of resonator-forming conductor layers, and may connect one end of the first through hole line to one end of the second through hole line.

The band-pass filter according to the present invention includes the first to third resonators. The second resonator and the third resonator are adjacent to each other in the circuit configuration, and electromagnetically coupled by magnetic coupling as main coupling. The first resonator is provided closer to the second resonator than to the third resonator in the circuit configuration, and jump-coupled to the third resonator. Therefore, according to the present invention, it is possible to provide the band-pass filter that can form an abrupt attenuation pole while satisfying a balance characteristic.

Other and further objects, features and advantages of the present invention will appear more fully from the following description.

DETAILED DESCRIPTION OF THE PREFERRED EMBODIMENTS

First Embodiment

Figure 1:
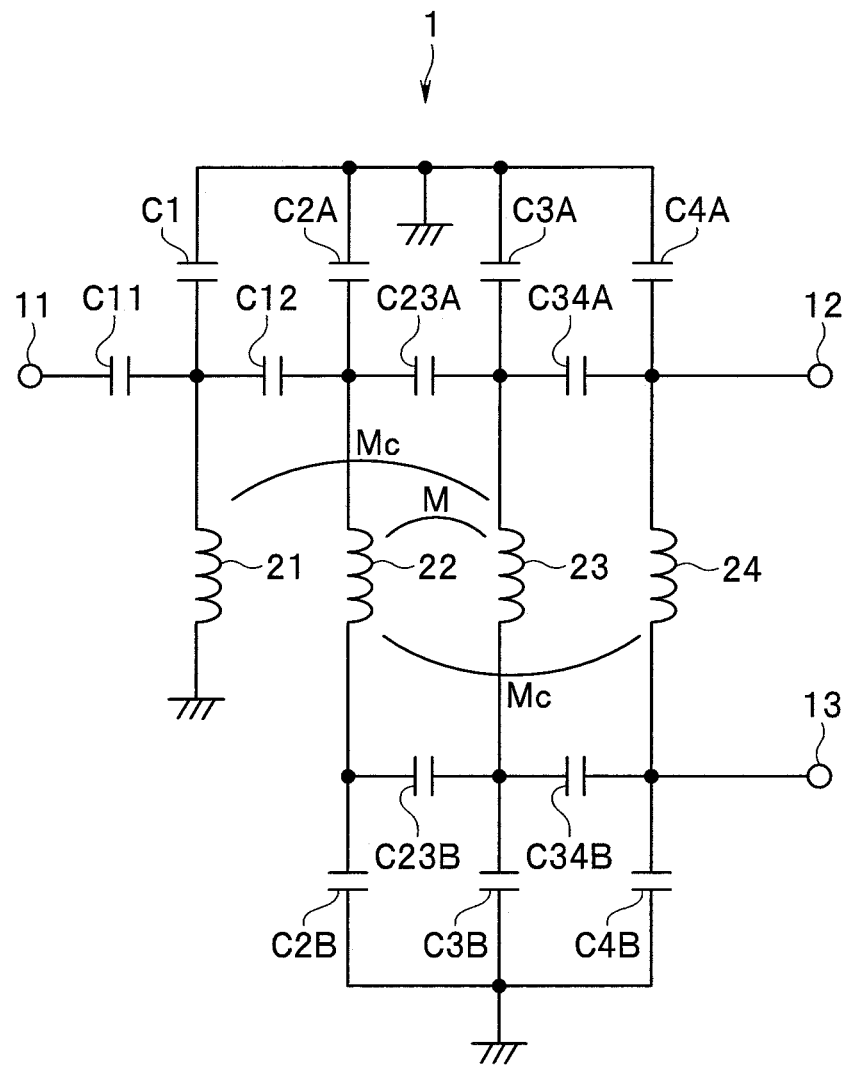
FIG. 1 is a circuit diagram showing the circuit configuration of a band-pass filter according to a first embodiment of the invention.

Preferred embodiments of the present invention will now be described in detail with reference to the drawings. First, reference is made to FIG. 1 to describe the circuit configuration of a band-pass filter according to the first embodiment of the invention. FIG. 1 shows the circuit configuration of the band-pass filter according to the present embodiment. As shown in FIG. 1, a band-pass filter 1 includes an unbalanced port 11, a first balanced port 12, a second balanced port 13, a port 14, a first resonator 21, a second resonator 22, a third resonator 23, and a fourth resonator 24.

The first to fourth resonators 21 to 24 are provided between the unbalanced port 11 and the first and second balanced ports 12 and 13 in the circuit configuration. The second resonator 22 and the third resonator 23 are adjacent to each other in the circuit configuration. The first resonator 21 is provided closer to the second resonator 22 than to the third resonator 23 in the circuit configuration. The fourth resonator 24 is provided closer to the third resonator 23 than to the second resonator 22 in the circuit configuration. In the present application, the expression of "in the(a) circuit configuration" is used to indicate not layout in physical configuration but layout in the circuit diagram.

Specifically in the present embodiment, the first to fourth resonators 21 to 24 are provided in this order from the side of the unbalanced port 11. That is, the second resonator 22 is provided closer to the unbalanced port 11 than the third resonator 23 in the circuit configuration. The first resonator 21 is provided between the unbalanced port 11 and the second resonator 22 in the circuit configuration. The fourth resonator 24 is provided between the first and second balanced ports 12 and 13 and the third resonator 23 in the circuit configuration.

The first resonator 21 is a resonator with one end shorted. The band-pass filter 1 further includes capacitors C1 and C11. The capacitor C1 connects one end of the first resonator 21 to a ground. The capacitor C11 connects the one end of the first resonator 21 to the unbalanced port 11. The other end of the first resonator 21 is connected to the ground.

The second to fourth resonators 22 to 24 each are a resonator with both ends open. The band-pass filter 1 further includes capacitors C2A, C2B, C3A, C3B, C4A, and C4B. The capacitor C2A connects one end of the second resonator 22 to the ground. The capacitor C2B connects the other end of the second resonator 22 to the ground. The capacitor C3A connects one end of the third resonator 23 to the ground. The capacitor C3B connects the other end of the third resonator 23 to the ground. The capacitor C4A connects one end of the fourth resonator 24 to the ground. The capacitor C4B connects the other end of the fourth resonator 24 to the ground.

The band-pass filter 1 further includes capacitors C12, C23A, C23B, C34A, and C34B. The capacitor C12 connects the one end of the first resonator 21 to the one end of the second resonator 22. The capacitor C23A connects the one end of the second resonator 22 to the one end of the third resonator 23. The capacitor C23B connects the other end of the second resonator 22 to the other end of the third resonator 23. The capacitor C34A connects the one end of the third resonator 23 to the one end of the fourth resonator 24. The capacitor C34B connects the other end of the third resonator 23 to the other end of the fourth resonator 24.

The first balanced port 12 is connected to the one end of the fourth resonator 24. The second balanced port 13 is connected to the other end of the fourth resonator 24.

The second resonator 22 and the third resonator 23 are magnetically coupled, and also capacitively coupled through the capacitors C23A and C23B. In FIG. 1, a curve indicated with a symbol M represents the magnetic coupling between the second resonator 22 and the third resonator 23. Here, out of magnetic coupling and capacitive coupling that contribute to electromagnetic coupling between two resonators, relatively strong coupling is referred to as main coupling, and the other is referred to as sub coupling. Specifically in the present embodiment, the second resonator 22 and the third resonator 23 are electromagnetically coupled by the magnetic coupling as the main coupling and the capacitive coupling as the sub coupling.

The first resonator 21 and the second resonator 22 are magnetically coupled, and also capacitively coupled through the capacitor C12. Specifically in the present embodiment, the first resonator 21 and the second resonator 22 are electromagnetically coupled by the capacitive coupling as the main coupling and the magnetic coupling as the sub coupling.

The third resonator 23 and the fourth resonator 24 are magnetically coupled, and also capacitively coupled through the capacitors C34A and C34B. Specifically in the present embodiment, the third resonator 23 and the fourth resonator 24 are electromagnetically coupled by the capacitive coupling as the main coupling and the magnetic coupling as the sub coupling.

The first resonator 21 is magnetically coupled to the third resonator 23, which is not adjacent to the first resonator 21 in the circuit configuration. The fourth resonator 24 is magnetically coupled to the second resonator 22, which is not adjacent to the fourth resonator 24 in the circuit configuration. Electromagnetic coupling between two resonators that are not adjacent to each other in a circuit configuration is referred to as jump-coupling. In FIG. 1, curves indicated with a symbol Mc represent the magnetic coupling between the two resonators that are not adjacent to each other in the circuit configuration.

The operation of the band-pass filter 1 will now be described. The band-pass filter 1 is a band-pass filter the pass band of which is predetermined. The band-pass filter 1 is a so-called balanced band-pass filter. The band-pass filter 1 is configured so that an unbalanced signal is received at and outputted from the unbalanced port 11, a first balanced element signal is received at and outputted from the first balanced port 12, and a second balanced element signal is received at and outputted from the second balanced port 13. The first balanced element signal and the second balanced element signal constitute a balanced signal. The band-pass filter 1 converts between balanced and unbalanced signals.

Figure 2:
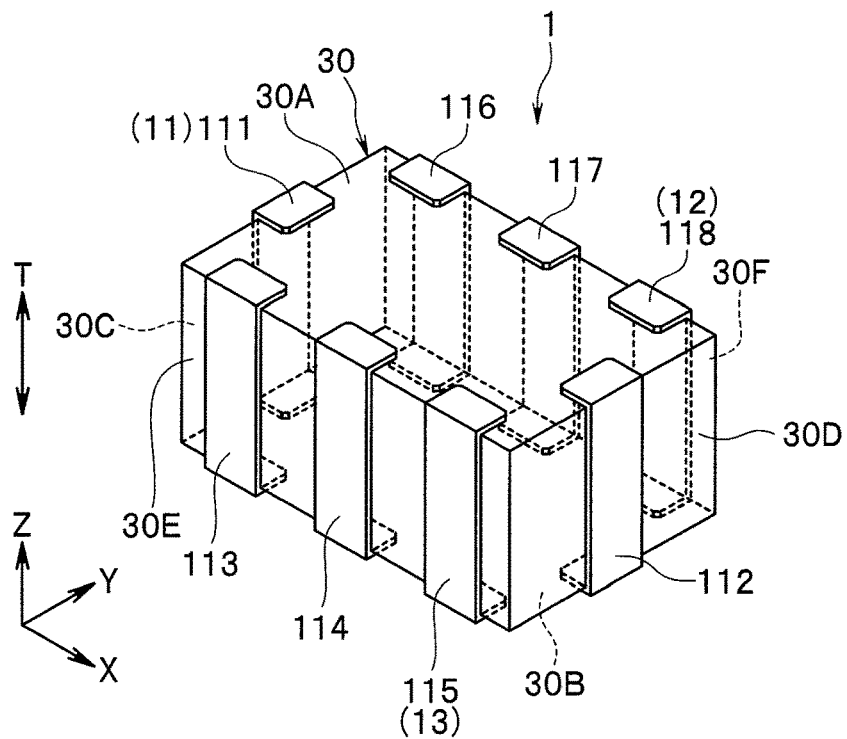
FIG. 2 is a perspective view showing the band-pass filter according to the first embodiment of the invention.
Figure 3:
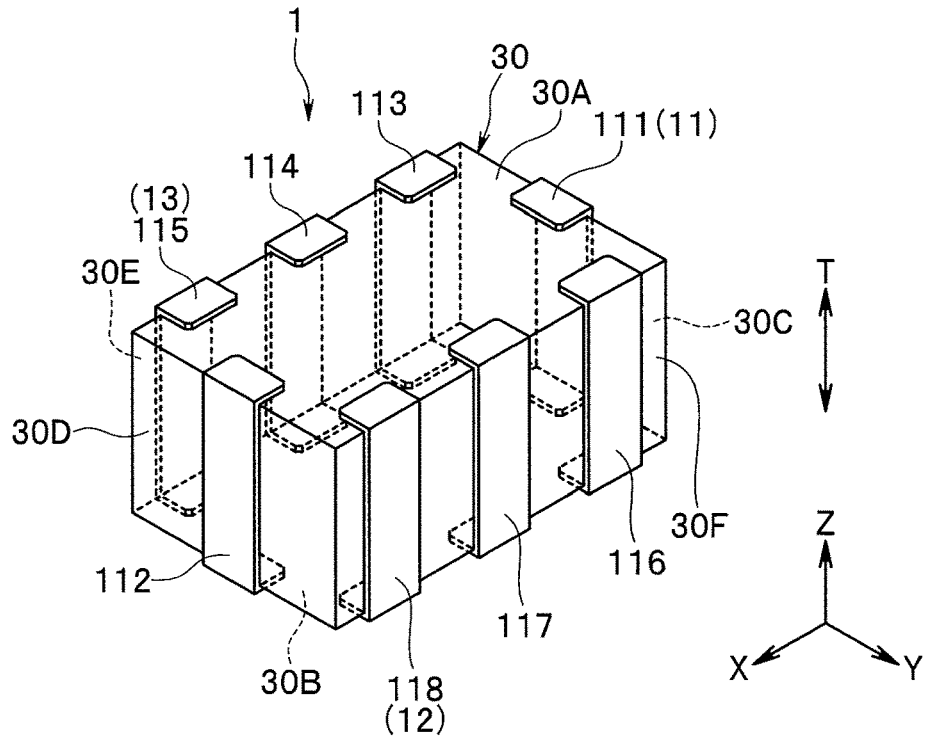
FIG. 3 is a perspective view showing the band-pass filter according to the first embodiment of the invention.
Figure 4:
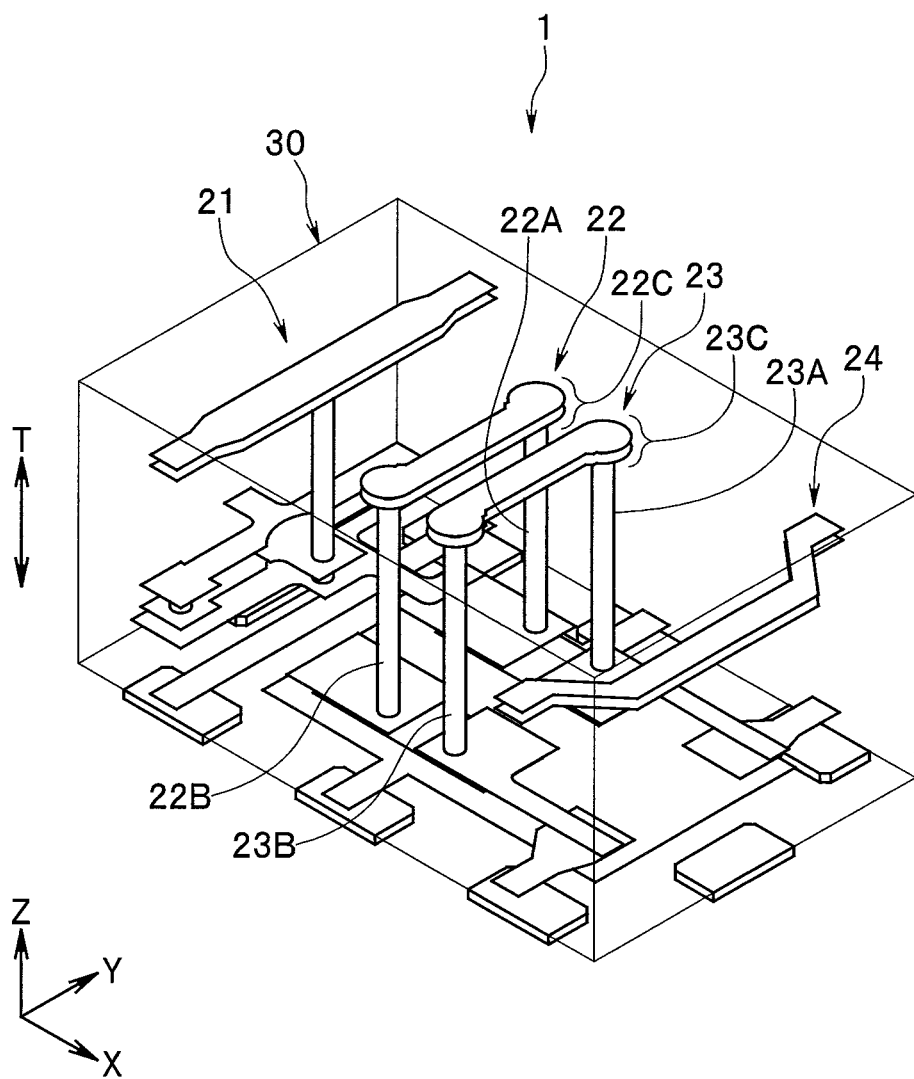
FIG. 4 is a perspective view showing the interior of the band-pass filter shown in FIG. 2 and FIG. 3.

Next, a structure of the band-pass filter 1 will be described with reference to FIGS. 2 to 4. FIGS. 2 and 3 are perspective views of the band-pass filter 1. FIG. 4 is a perspective view showing the interior of the band-pass filter 1. The band-pass filter 1 further includes a stack 30 for integrating the ports 11 to 13, the first to fourth resonators 21 to 24, and the capacitors C1, C2A, C2B, C3A, C3B, C4A, C4B, C11, C12, C23A, C23B, C34A and C34B. Although details will be described later, the stack 30 includes a plurality of stacked dielectric layers, a plurality of stacked conductor layers, and a plurality of through holes.

The stack 30 is shaped like a rectangular solid. The stack 30 includes a top surface 30A, a bottom surface 30B, and four side surfaces 30C to 30F, which constitute the periphery of the stack 30. The top surface 30A and the bottom surface 30B are opposite each other. The side surfaces 30C and 30D are opposite each other. The side surfaces 30E and 30F are opposite each other. The side surfaces 30C to 30F are perpendicular to the top surface 30A and the bottom surface 30B. In the stack 30, the plurality of dielectric layers and the plurality of conductor layers are stacked in the direction perpendicular to the top surface 30A and the bottom surface 30B. This direction will be referred to as the stacking direction. The stacking direction is shown by the arrow T in FIG. 2 to FIG. 4. The top surface 30A and the bottom surface 30B are located at opposite ends in the stacking direction T.

Here, X, Y, and Z directions are defined as shown in FIGS. 2 to 4. The X, Y, and Z directions are orthogonal to one another. In the present embodiment, a direction parallel to the stacking direction T will be referred to as the Z direction. The opposite directions to the X, Y, and Z directions are defined as −X, −Y, and −Z directions, respectively.

As shown in FIGS. 2 and 3, the top surface 30A is located at the end of the stack 30 in the −Z direction. The bottom surface 30B is located at the end of the stack 30 in the direction. The side surface 30C is located at the end of the stack 30 in the −X direction. The side surface 30D is located at the end of the stack 30 in the X direction. The side surface 30E is located at the end of the stack 30 in the −Y direction. The side surface 30F is located at the end of the stack 30 in the Y direction.

The band-pass filter 1 further includes first to eighth terminals 111, 112, 113, 114, 115, 116, 117, and 118. The first terminal 111 is located to extend from the top surface 30A to the bottom surface 30B via the side surface 30C. The first terminal 112 is located to extend from the top surface 30A to the bottom surface 30B via the side surface 30D. Each of the third to fifth terminals 113 to 115 is located to extend from the top surface 30A to the bottom surface 30B via the side surface 30E. The third to fifth terminals 113 to 115 are arranged in this order in the X direction. Each of the sixth to eighth terminals 116 to 118 is located to extend from the top surface 30A to the bottom surface 30B via the side surface 30F. The sixth to eighth terminals 116 to 118 are arranged in this order in the X direction.

The first terminal 111 corresponds to the unbalanced port 11. The fifth terminal 115 corresponds to the second balanced port 13. The eighth terminal 118 corresponds to the first balanced port 12. The fourth terminal 114 corresponds to the second balanced port 13. Each of the third, fourth, sixth and seventh terminals 113, 114, 116 and 117 is connected to the ground.

The stack 30 will be described in detail with reference to FIG. 5A to FIG. 11B. The multilayer stack 30 includes twenty-six dielectric layers stacked on each other. The twenty-six dielectric layers will be referred to as the first to twenty-sixth dielectric layers in the order from bottom to top. The first to twenty-sixth dielectric layers will be denoted by the reference numerals 31 to 56.

Figure 5A:
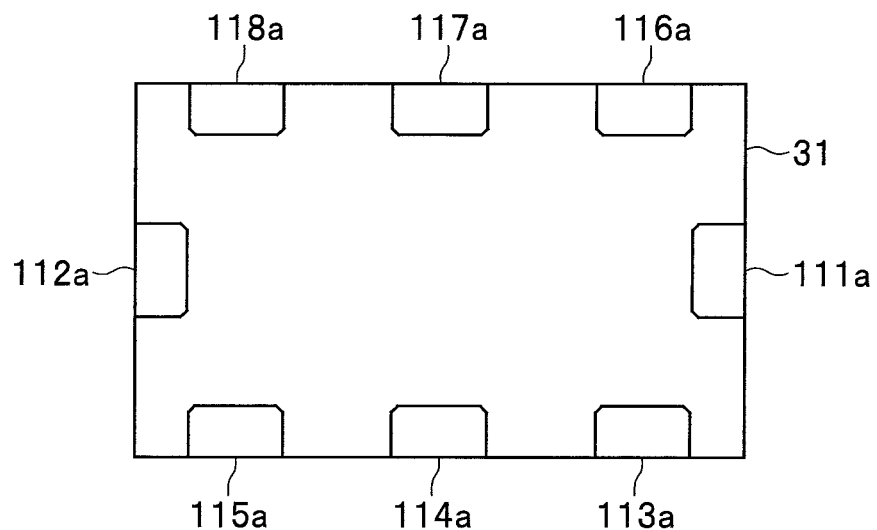
FIG. 5A and FIG. 5B are explanatory diagrams showing respective patterned surfaces of first and second dielectric layers of the stack of the band-pass filter shown in FIG. 2 and FIG. 3.

FIG. 5A shows the patterned surface of the first dielectric layer 31. FIG. 5A shows terminal parts 111a to 118a constituting parts of the terminals 111 to 118, respectively.

Figure 5B:
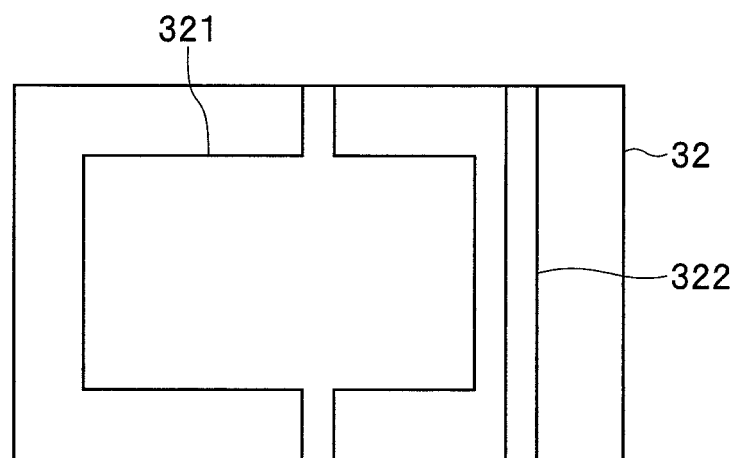

FIG. 5B shows the patterned surface of the second dielectric layer 32. A ground conductor layers 321 and 322 are formed on the patterned surface of the dielectric layer 32. The conductor layer 321 is connected to the fourth and seventh terminals 114 and 117. The conductor layer 322 is connected to the third and sixth terminals 113 and 116.

Figure 6A:
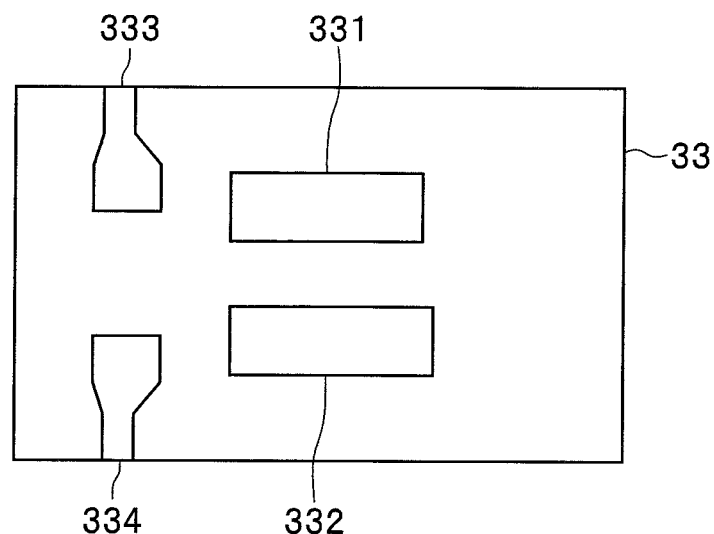
FIG. 6A and FIG. 6B are explanatory diagrams showing respective patterned surfaces of third and fourth dielectric layers of the stack of the band-pass filter shown in FIG. 2 and FIG. 3.

FIG. 6A shows the patterned surface of the third dielectric layer 33. A conductor layers 331, 332, 333 and 334 are formed on the patterned surface of the dielectric layer 33. The conductor layer 333 is connected to the eighth terminal 118. The conductor layer 334 is connected to the fifth terminal 115.

Figure 6B:
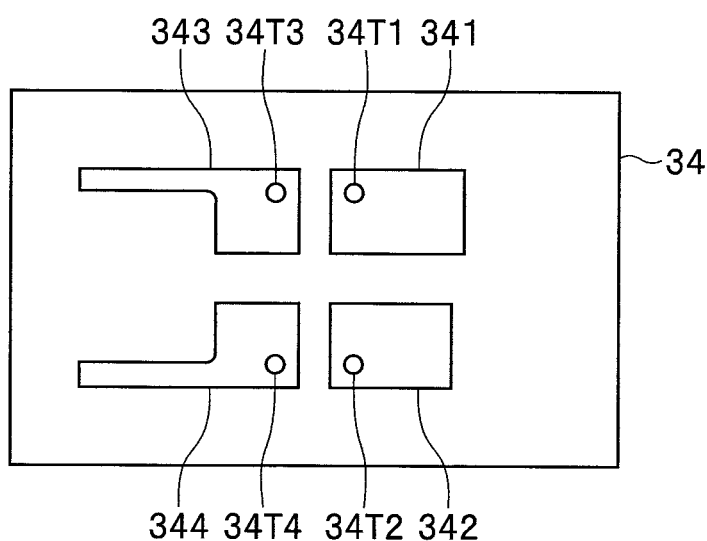

FIG. 6B shows the patterned surface of the fourth dielectric layer 34. A conductor layers 341, 342, 343 and 344 are formed on the patterned surface of the dielectric layer 34. Further, through holes 34T1, 34T2, 34T3 and 34T4 are formed in the dielectric layer 34. The through holes 34T1, 34T2, 34T3 and 34T4 are connected to the conductor layers 341, 342, 343 and 344, respectively.

Figure 7A:
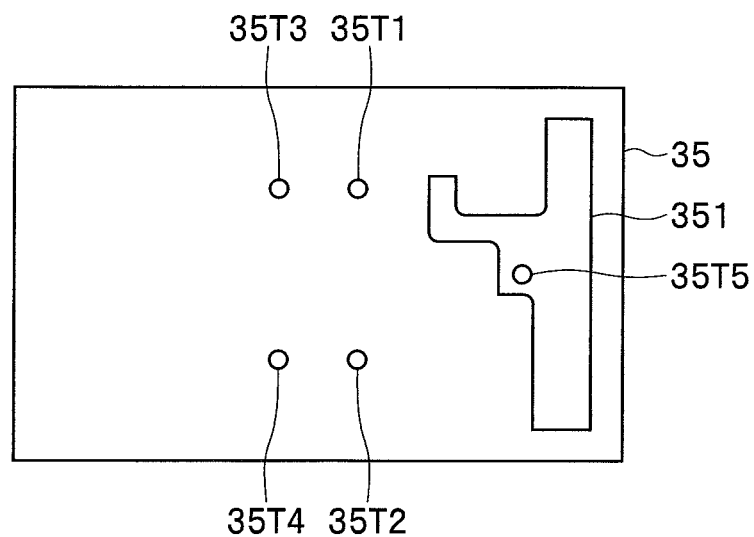
FIG. 7A and FIG. 7B are explanatory diagrams showing respective patterned surfaces of fifth and sixth dielectric layers of the stack of the band-pass filter shown in FIG. 2 and FIG. 3.

FIG. 7A shows the patterned surface of the fifth dielectric layer 35. A conductor layer 351 is formed on the patterned surface of the dielectric layer 35. Further, through holes 35T1, 35T2, 35T3, 35T4 and 35T5 are formed in the dielectric layer 35. The through holes 34T1, 34T2, 34T3 and 34T4 formed in the fourth dielectric layer 34 are connected to the through holes 35T1, 35T2, 35T3 and 35T4, respectively. The through hole 35T5 is connected to the conductor layer 351.

Figure 7B:
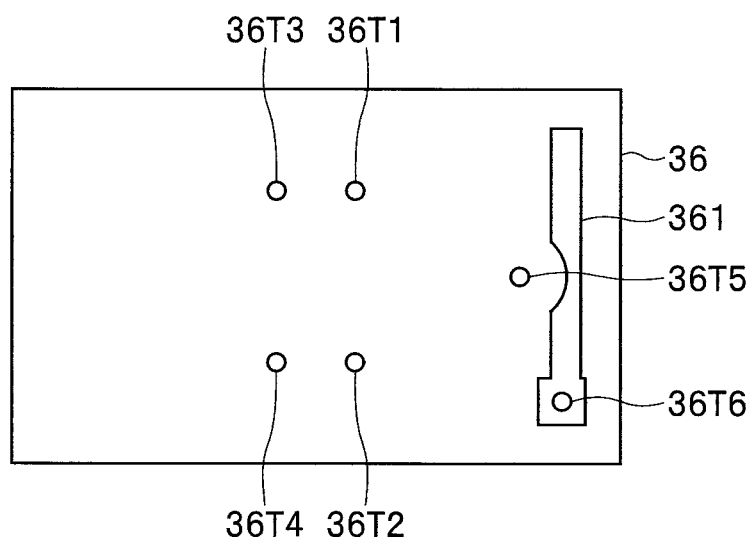

FIG. 7B shows the patterned surface of the sixth dielectric layer 36. A conductor layer 361 is formed on the patterned surface of the dielectric layer 36. Further, through holes 36T1, 36T2, 36T3, 36T4, 36T5 and 36T6 are formed in the dielectric layer 36. The through holes 35T1, 35T2, 35T3, 35T4 and 35T5 formed in the fifth dielectric layer 35 are connected to the through holes 36T1, 36T2, 36T3, 36T4 and 36T5, respectively. The through hole 36T6 is connected to the conductor layer 361.

Figure 8A:
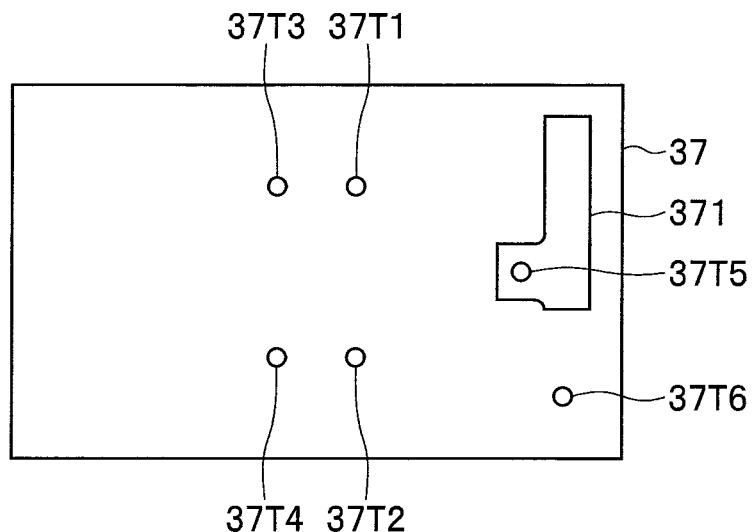
FIG. 8A and FIG. 8B are explanatory diagrams showing respective patterned surfaces of seventh and eighth dielectric layers of the stack of the band-pass filter shown in FIG. 2 and FIG. 3.

FIG. 8A shows the patterned surface of the seventh dielectric layer 37. A conductor layer 371 is formed on the patterned surface of the dielectric layer 37. Further, through holes 37T1, 37T2, 37T3, 37T4, 37T5 and 37T6 are formed in the dielectric layer 37. The through holes 36T1, 36T2, 36T3, 36T4 and 36T6 formed in the sixth dielectric layer 36 are connected to the through holes 37T1, 37T2, 37T3, 37T4 and 37T6, respectively. The through hole 37T5 and the through hole 36T5 formed in the dielectric layer 36 are connected to the conductor layer 371.

Figure 8B:
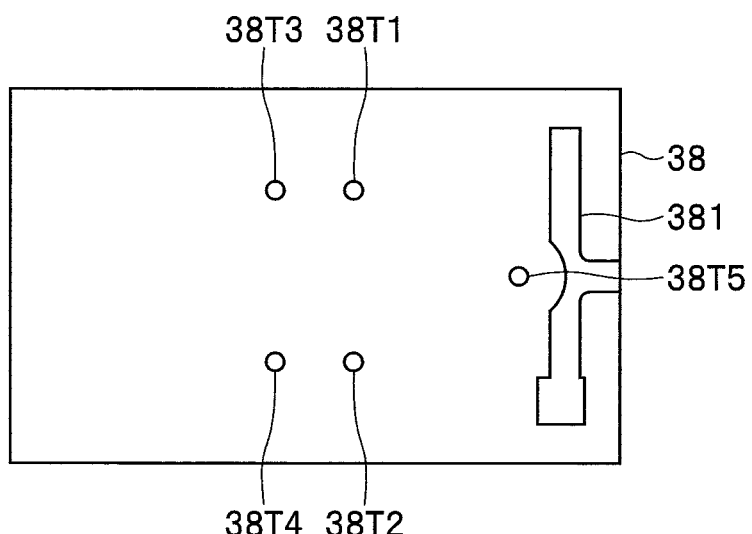

FIG. 8B shows the patterned surface of the eighth dielectric layer 38. A conductor layer 381 is formed on the patterned surface of the dielectric layer 38. The conductor layer 381 is connected to the first terminal 111. Further, through holes 38T1, 38T2, 38T3, 38T4 and 38T5 are formed in the dielectric layer 38. The through holes 37T1, 37T2, 37T3, 37T4 and 37T5 formed in the seventh dielectric layer 37 are connected to the through holes 38T1, 38T2, 38T3, 38T4 and 38T5, respectively. The through hole 37T6 formed in the seventh dielectric layer 37 is connected to the conductor layer 381.

Figure 9A:
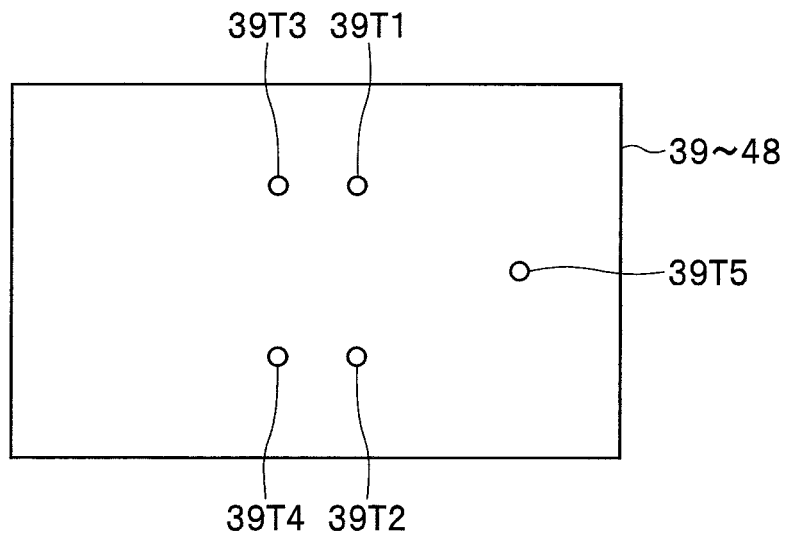
FIG. 9A is an explanatory diagram showing a patterned surface of each of a ninth to an eighteenth dielectric layer of the stack of the band-pass filter shown in FIG. 2 and FIG. 3.

FIG. 9A shows the patterned surface of each of the ninth to eighteenth dielectric layers 39 to 48. In each of the dielectric layers 39 to 48, there are formed through holes 39T1, 39T2, 39T3, 39T4 and 39T5. The through holes 38T1, 38T2, 38T3, 38T4 and 38T5 formed in the eighth dielectric layer 38 are connected to the through holes 39T1, 39T2, 39T3, 39T4 and 39T5 formed in the ninth dielectric layer 39, respectively. In the dielectric layers 39 to 48, every vertically adjacent through holes denoted by the same reference signs are connected to each other.

Figure 9B:
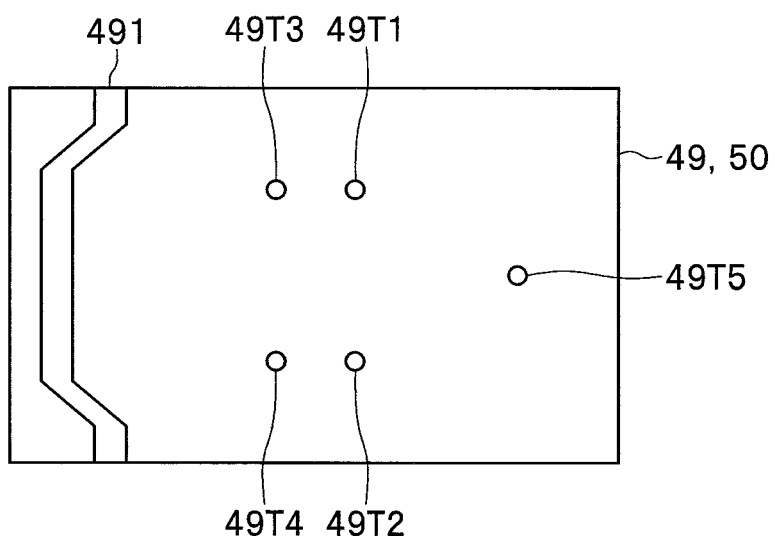
FIG. 9B is an explanatory diagram showing a patterned surface of each of a nineteenth and a twentieth dielectric layer of the stack of the band-pass filter shown in FIG. 2 and FIG. 3.

FIG. 9B shows the patterned surface of each of the nineteenth and twentieth dielectric layers 49 and 50. A resonator-forming conductor layer 491 is formed on the patterned surface of each of the dielectric layers 49 and 50. The resonator-forming conductor layer 491 is connected to the fifth and eighth terminals 115 and 118. Further, in each of the dielectric layers 49 and 50, there are formed through holes 49T1, 49T2, 49T3, 49T4 and 49T5. The through holes 39T1, 39T2, 39T3, 39T4 and 39T5 formed in the eighteenth dielectric layer 48 are connected to the through holes 49T1, 49T2, 49T3, 49T4 and 49T5 formed in the nineteenth dielectric layer 49, respectively. In the dielectric layers 49 and 50, every vertically adjacent through holes denoted by the same reference signs are connected to each other.

Figure 10A:
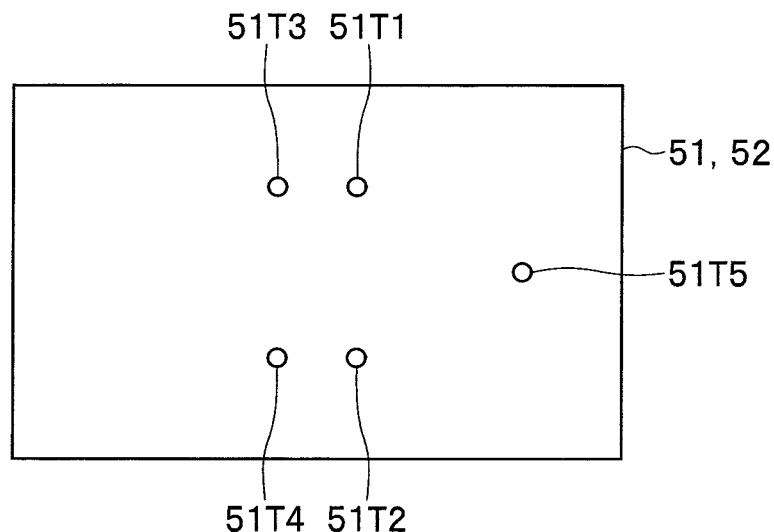
FIG. 10A is an explanatory diagram showing a patterned surface of each of a twenty-first and a twenty-second dielectric layer of the stack of the band-pass filter shown in FIG. 2 and FIG. 3.

FIG. 10A shows the patterned surface of each of the twenty-first and twenty-second dielectric layers 51 and 52. In each of the dielectric layers 51 and 52, there are formed through holes 51T1, 51T2, 51T3, 51T4 and 51T5. The through holes 49T1, 49T2, 49T3, 49T4 and 49T5 formed in the twentieth dielectric layer 50 are connected to the through holes 51T1, 51T2, 51T3, 51T4 and 51T5 formed in the twenty-first dielectric layer 51, respectively. In the dielectric layers 51 and 52, every vertically adjacent through holes denoted by the same reference signs are connected to each other.

Figure 10B:
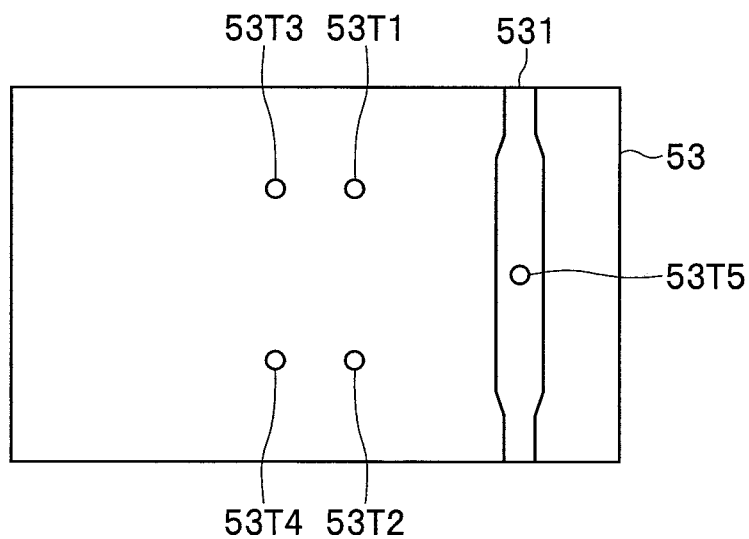
FIG. 10B is an explanatory diagram showing a patterned surface of a twenty-third dielectric layer of the stack of the band-pass filter shown in FIG. 2 and FIG. 3.

FIG. 10B shows the patterned surface of the twenty-third dielectric layer 53. A resonator-forming conductor layer 531 is formed on the patterned surface of the dielectric layer 53. The resonator-forming conductor layer 531 is connected to the third and sixth terminals 113 and 116. Further, through holes 53T1, 53T2, 53T3, 53T4 and 53T5 are formed in the dielectric layer 53. The through holes 51T1, 51T2, 51T3 and 51T4 formed in the twenty-second dielectric layer 52 are connected to the through holes 53T1, 53T2, 53T3 and 53T4, respectively. The through hole 53T5 and the through hole 51T5 formed in the twenty-second dielectric layer 52 are connected to part of the resonator-forming conductor layer 531, i.e. a portion including the middle of the resonator-forming conductor layer 531 in a longitudinal direction.

Figure 11A:
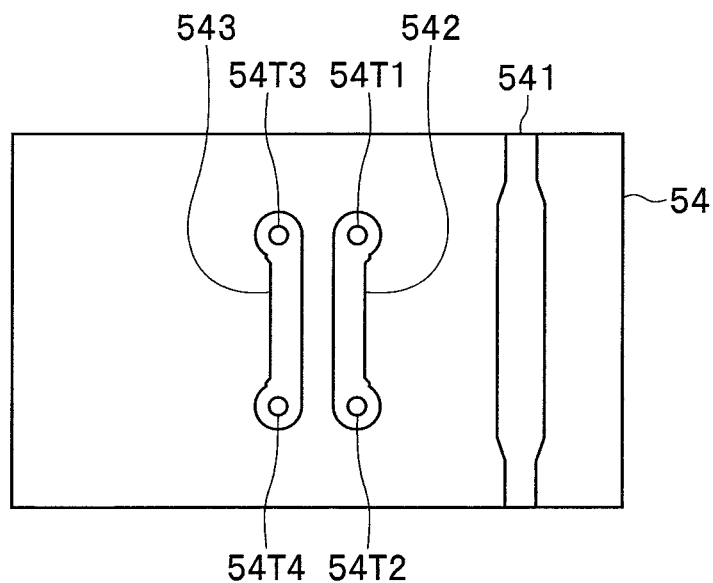
FIGS. 11A and 11B are explanatory diagrams showing respective patterned surfaces of twenty-fourth and twenty-fifth dielectric layers of the stack of the hand-pass filter shown in FIG. 2 and FIG. 3.

FIG. 11A shows the patterned surface of the twenty-fourth dielectric layer 54. Resonator-forming conductor layers 541, 542 and 543 are formed on the patterned surface of the dielectric layer 54. The resonator-forming conductor layer 541 is connected to the third and sixth terminals 113 and 116. The through hole 53T5 formed in the twenty-third dielectric layer 53 is connected to part of the resonator-forming conductor layer 541, i.e. a portion including the middle of the resonator-forming conductor layer 541 in the longitudinal direction. Each of the resonator-forming conductor layers 542 and 543 has a first end and a second end opposite to each other.

Further, through holes 54T1, 54T2, 54T3 and 54T4 are formed in the dielectric layer 54. The through hole 54T1 and the through hole 53T1 formed in the dielectric layer 53 are connected to a portion of the resonator-forming conductor layers 542 near the first end thereof. The through hole 54T2 and the through hole 53T2 formed in the dielectric layer 53 are connected to a portion of the resonator-forming conductor layers 542 near the second end thereof. The through hole 54T3 and the through hole 53T3 formed in the dielectric layer 53 are connected to a portion of the resonator-forming conductor layers 543 near the first end thereof. The through hole 54T4 and the through hole 53T4 formed in the dielectric layer 53 are connected to a portion of the resonator-forming conductor layers 543 near the second end thereof.

Figure 11B:
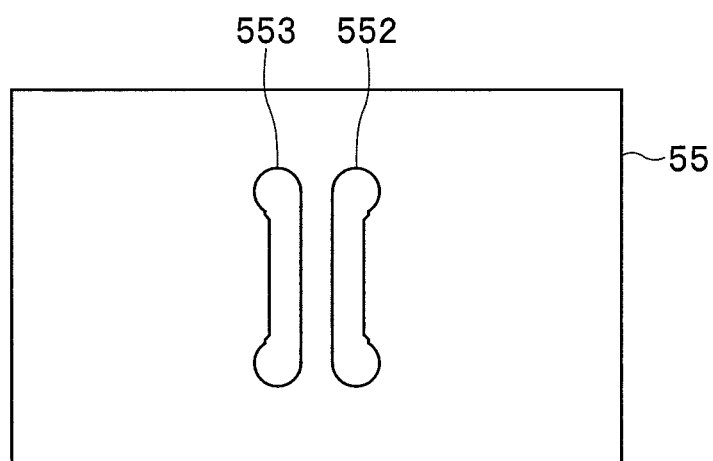

FIG. 11B shows the patterned surface of the twenty-fifth dielectric layer 55. Resonator-forming conductor layer 552 and 553 are formed on the patterned surface of the dielectric layer 55. Each of the resonator-forming conductor layers 552 and 553 has a first end and a second end opposite to each other. The through hole 54T1 formed in the dielectric layer 54 is connected to a portion of the resonator-forming conductor lavers 552 near the first end thereof. The through hole 54T2 formed in the dielectric layer 54 is connected to a portion of the resonator-forming conductor layers 552 near the second end thereof. The through hole 54T3 formed in the dielectric layer 54 is connected to a portion of the resonator-forming conductor layers 553 near the first end thereof. The through hole 54T4 formed in the dielectric layer 54 is connected to a portion of the resonator-forming conductor layers 553 near the second end thereof.

Although it is not shown in the drawing, a mark may be formed in the patterned surface of the twenty-sixth dielectric layer 56.

The stack 30 shown in FIGS. 2 and 3 is formed by stacking the first to twenty-sixth dielectric layers 31 to 56 such that the patterned surface of the first dielectric layer 31 serves as the bottom surface 30B of the stack 30 and the surface of the twenty-sixth dielectric layer 56 opposite to the patterned surface thereof serves as the top surface 30A of the stack 30. The first to eighth terminals 111 to 118 are then formed on the periphery of the stack 30, whereby the band-pass filter 1 shown in FIGS. 2 and 3 is completed.

A correspondence between the components of the band-pass filter 1 and the components inside the stack 30 shown in FIGS. 5A to 11B will be described below. The plurality of the dielectric lavers of the stack 30 include the plurality of resonator-forming conductor layers 491, 531, 541, 542, 543, 552, and 553 to constitute the first to fourth resonators 21 to 24. The plurality of through holes of the stack 30 include a plurality of resonator-forming through holes to constitute the first to fourth resonators 21 to 24.

The first resonator 21 is formed of the resonator-forming conductor layers 531 and 541, the through holes 35T5, 36T5, 37T5, 38T5 and 53T5, the through hole 39T5 formed in each of the dielectric layer 39 to 48, the through hole 49T5 formed in each of the dielectric layer 49 and 50, and the through hole 51T5 formed in each of the dielectric layers 51 and 52.

The second resonator 22 is formed of the resonator-forming conductor layers 542 and 552, the through holes 34T1, 34T2, 35T1, 35T2, 36T1, 36T2, 37T1, 37T2, 38T1, 38T2, 53T1 and 53T2, the through holes 39T1 and 39T2 formed in each of the dielectric layer 39 to 48, the through holes 49T1 and 49T2 formed in each of the dielectric layer 49 and 50, and the through holes 51T1 and 51T2 formed in each of the dielectric layers 51 and 52.

As shown in FIG. 4, the second resonator 22 includes a first through hole line 22A, a second through hole line 22B, and a conductor layer portion 22C. The first through hole line 22A is formed of the through holes 34T1, 35T1, 36T1, 37T1, 38T1, and 53T1, the through holes 39T1 formed in each of the dielectric layers 39 to 48, the through holes 49T1 formed in each of the dielectric layers 49 and 50, and the through holes 51T1 formed in each of the dielectric layers 51 and 52 connected in series. The first through hole line 22A penetrates the dielectric layers 34 to 53.

The second through hole line 22B is formed of the through holes 34T2, 35T2, 36T2, 37T2, 38T2, and 53T2, the through holes 39T2 formed in each of the dielectric layers 39 to 48, the through holes 49T2 formed in each of the dielectric layers 49 and 50, and the through holes 51T2 formed in each of the dielectric layers 51 and 52 connected in series. The second through hole line 22B penetrates the dielectric layers 34 to 53.

The conductor layer portion 22C is formed of the resonator-forming conductor layers 542 and 552 that are connected to each other via the through holes 54T1 and 54T2. The conductor layer portion 22C connects one end of the first through hole line 22A to one end of the second through hole line 22B.

The third resonator 23 is formed of the resonator-forming conductor layers 543 and 553, the through holes 34T3, 34T4, 35T3, 35T4, 36T3, 36T4, 37T3, 37T4, 38T3, 38T4, 53T3, 53T4, 54T3, and 54T4, the through holes 39T3 and 39T4 formed in each of the dielectric layer 39 to 48, the through holes 49T3 and 49T4 formed in each of the dielectric layer 49 and 50, and the through holes 51T3 and 51T4 formed in each of the dielectric layers 51 and 52.

As shown in FIG. 4, the third resonator 23 includes a first through hole line 23A, a second through hole line 23B, and a conductor layer portion 23C. The first through hole line 23A is formed of the through holes 34T3, 35T3, 36T3, 37T3, 38T3, and 53T3, the through holes 39T3 formed in each of the dielectric layers 39 to 48, the through holes 49T3 formed in each of the dielectric layers 49 and 50, and the through holes 51T3 formed in each of the dielectric layers 51 and 52 connected in series. The first through hole line 23A penetrates the dielectric layers 34 to 53.

The second through hole line 23B is formed of the through holes 34T4, 35T4, 36T4, 37T4, 38T4, and 53T4, the through holes 39T4 formed in each of the dielectric layers 39 to 48, the through holes 49T4 formed in each of the dielectric layers 49 and 50, and the through holes 51T4 formed in each of the dielectric layers 51 and 52 connected in series. The second through hole line 23B penetrates the dielectric layers 34 to 53.

The conductor layer portion 23C is formed of the resonator-forming conductor layers 543 and 553 that are connected to each other via the through holes 54T3 and 54T4. The conductor layer portion 22C connects one end of the first through hole line 23A to one end of the second through hole line 23B.

The fourth resonator 24 is formed of the resonator-forming conductor layer 491 formed in each of the dielectric layer 49 and 50.

The capacitor C1 is formed of the conductor layers 322 and 351, and the dielectric layers 32 to 34 interposed between the conductor layers 322 and 351.

The capacitor C2A is formed of the conductor layers 321 and 341, and the dielectric layers 32 and 33 interposed between the conductor layers 321 and 341. The capacitor C2B is formed of the conductor layers 321 and 342, and the dielectric layers 32 and 33 interposed between the conductor layers 321 and 342.

The capacitor C3A is formed of the conductor layers 321 and 343, and the dielectric layers 32 and 33 interposed between the conductor layers 321 and 343. The capacitor C3B is formed of the conductor layers 321 and 344, and the dielectric layers 32 and 33 interposed between the conductor layers 321 and 344.

The capacitor C4A is formed of the conductor layers 321 and 333, and the dielectric layer 32 interposed between the conductor layers 321 and 333. The capacitor C4B is formed of the conductor layers 321 and 334, and the dielectric layer 32 interposed between the conductor layers 321 and 334.

The capacitor C11 is formed of the conductor layers 351, 361, 371 and 381, the dielectric layer 35 interposed between the conductor layers 351 and 361, the dielectric layer 36 interposed between the conductor layers 361 and 371, and the dielectric layer 37 interposed between the conductor layers 371 and 381. The capacitor C12 is formed of the conductor layers 341 and 351, and the dielectric layer 34 interposed between the conductor layers 341 and 351.

The capacitor C23A is formed of the conductor layers 331, 341 and 343, and the dielectric layer 33 interposed between the conductor layer 331 and the conductor layers 341 and 343. The capacitor C23B is formed of the conductor layers 332, 342 and 344, and the dielectric layer 33 interposed between the conductor layer 332 and the conductor layers 342 and 344.

The capacitor C34A is formed of the conductor layers 333 and 343, and the dielectric layer 33 interposed between the conductor layers 333 and 343. The capacitor C34B is formed of the conductor layers 334 and 344, and the dielectric layer 33 interposed between the conductor layers 334 and 344.

Next, structural features of the band-pass filter 1 will be described. As shown in FIG. 4, the distance between the second resonator 22 and the third resonator 23 is shorter than that between the first resonator 21 and the second resonator 22, and is shorter than that between the third resonator 23 and the fourth resonator 24.

As shown in FIG. 9B, the resonator-forming conductor layer 491 formed in the dielectric layer 49 and the resonator-forming conductor layer 491 formed in the dielectric layer 50 are located so as to overlap each other when viewed from the Z direction. As shown in FIGS. 10B and 11A, the resonator-forming conductor layer 531 formed in the dielectric layer 53 and the resonator-forming conductor layer 541 formed in the dielectric layer 54 are located so as to overlap each other when viewed from the Z direction. As shown in FIGS. 11A and 11B, the resonator-forming conductor layer 542 formed in the dielectric layer 54 and the resonator-forming conductor layer 552 formed in the dielectric layer 55 are located so as to overlap each other when viewed from the Z direction. The resonator-forming conductor layer 543 formed in the dielectric layer 54 and the resonator-forming conductor layer 553 formed in the dielectric layer 55 are located so as to overlap each other when viewed from the Z direction.

As described above, in the band-pass filter 1 according to the present embodiment, the second resonator 22 and the third resonator 23 are electromagnetically coupled by the magnetic coupling as the main coupling. The first resonator 21 is jump-coupled to the third resonator 23. The fourth resonator 24 is jump-coupled to the second resonator 22. According to the present embodiment, these couplings can form an attenuation pole at which insertion loss abruptly varies in each of a first vicinity range that is a frequency range lower than the pass band and in the vicinity of the pass band and a second vicinity range that is a frequency range higher than the pass band and in the vicinity of the pass band.

The attenuation pole will be hereinafter described with reference to simulation results. In simulation, first to fifth models of a band-pass filter having the same circuit configuration as that of the band-pass filter 1 of the present embodiment were used. In the simulation, the band-pass filter was designed so as to have a pass band between 3.3 and 3.9 GHz. In the simulation, the pass characteristic of the band-pass filter was represented using a mixed mode S parameter, which represented a response of a difference signal between first and second balanced element signals outputted from the first and second balanced ports 12 and 13 when an unbalanced signal was inputted to the unbalanced port 11. The S parameter is hereinafter referred to as insertion loss.

Here, a symbol k23 represents a magnetic coupling coefficient between the second resonator 22 and the third resonator 23. A symbol k13 represents a magnetic coupling coefficient of the jump-coupling between the first resonator 21 and the third resonator 23. A symbol k24 represents a magnetic coupling coefficient of the jump-coupling between the second resonator 22 and the fourth resonator 24. In the first to fifth models, each of the magnetic coupling coefficients k23, k13, and k24 varied from each other. In the simulation, the pass characteristic of each of the first to fifth models as obtained.

First, the pass characteristic of each of the first and second models will be described. In the first model, the magnetic coupling coefficient k23 was set at 0.37, and the magnetic coupling coefficients k13 and k24 of the jump-coupling each were set at 0. In the second model, the magnetic coupling coefficient k23 was set at 0.07, and the magnetic coupling coefficients k13 and k24 of the jump-coupling each were set at 0.

Figure 12:
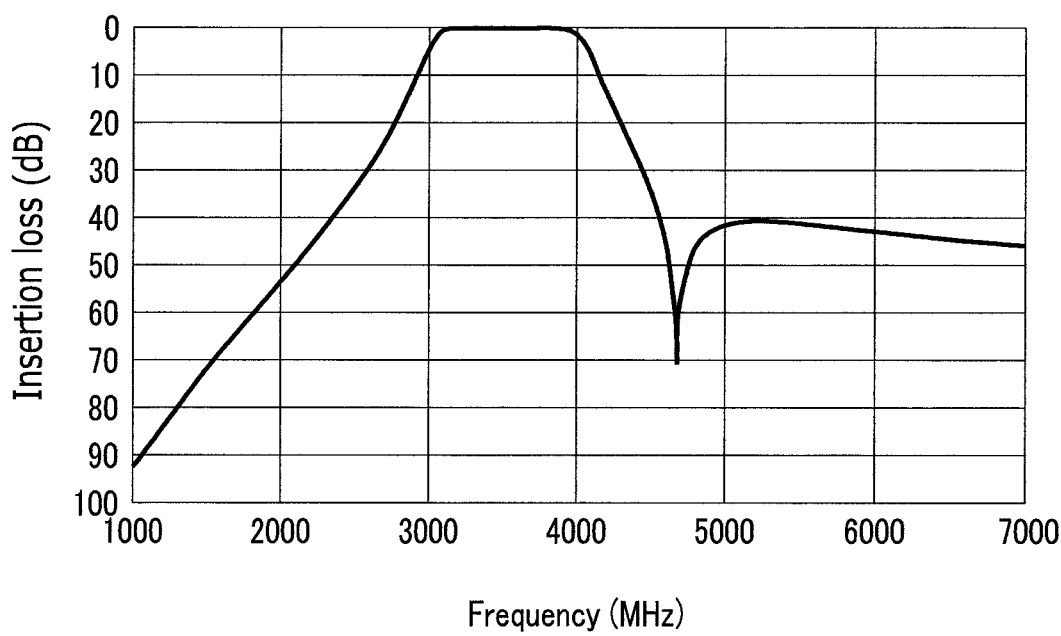
FIG. 12 is a characteristic diagram showing the pass characteristics of a first model of a hand-pass filter.
Figure 13:
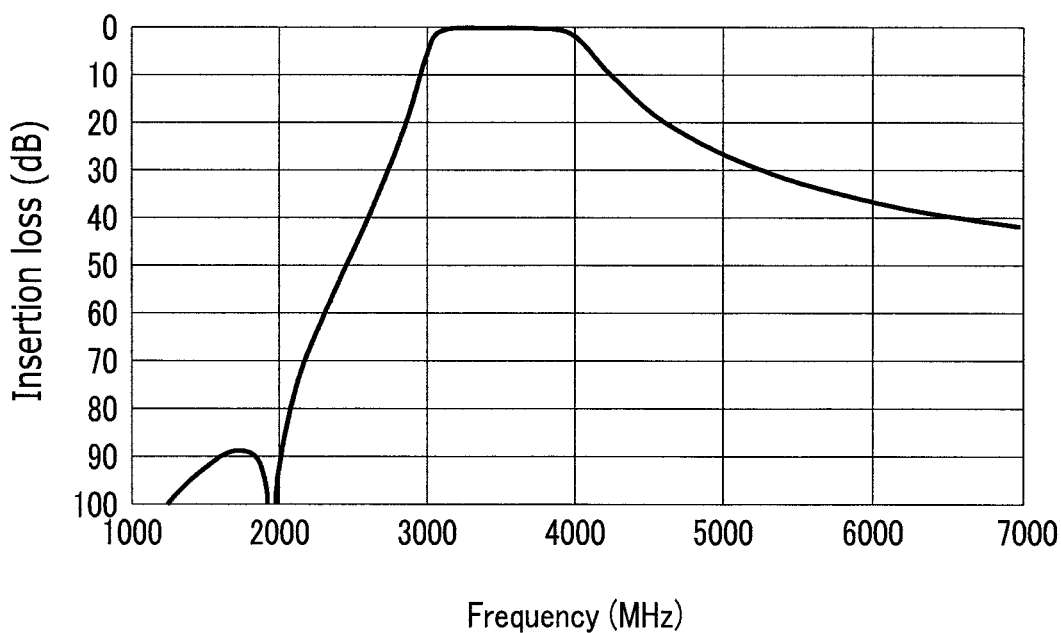
FIG. 13 is a characteristic diagram showing the pass characteristics of a second model of the band-pass filter.

FIG. 12 shows the pass characteristic of the first model. FIG. 13 shows the pass characteristic of the second model. In each of FIGS. 12 and 13, the horizontal axis represents frequency, and the vertical axis represents insertion loss. It is found from FIG. 12 that in a case where the second resonator 22 and the third resonator 23 are electromagnetically coupled by the magnetic coupling as the main coupling with the increased magnetic coupling coefficient k23, an attenuation pole is formed in a frequency range higher than the pass band of the band-pass filter.

It is also found from FIG. 13 that when the second resonator 22 and the third resonator 23 are electromagnetically coupled by the capacitive coupling as the main coupling with the decreased magnetic coupling coefficient k23, an attenuation pole is formed in a frequency range lower than the pass band of the band-pass filter.

In general, in a band-pass filter constituted by two resonators, it is known that when a magnetic coupling coefficient between the two resonators relatively increases and a coupling capacitance between the two resonators relatively decreases, an attenuation pole is formed in a frequency range higher than a center frequency of a pass band of the band-pass filter. In the first and second models, the magnetic coupling coefficients k13 and k24 of the jump-coupling are set at 0, in order to clarify a variation of the attenuation pole due to difference in the electromagnetic coupling between the second resonator 22 and the third resonator 23. However, the foregoing explanation of the variation of the attenuation pole holds true for the magnetic coupling coefficients k13 and k24 having a value other than 0. In the present embodiment, as described above, the electromagnetic coupling between the second resonator 22 and the third resonator 23 by the magnetic coupling as the main coupling allows formation of the attenuation pole in the second vicinity range.

Next, the pass characteristic of the third model will be described. In the third model, the magnetic coupling coefficient k23 was set at 0.37. The magnetic coupling coefficient k13 of jump-coupling was 0.032, and the magnetic coupling coefficient k24 of the jump-coupling was set at 0.

Figure 14:
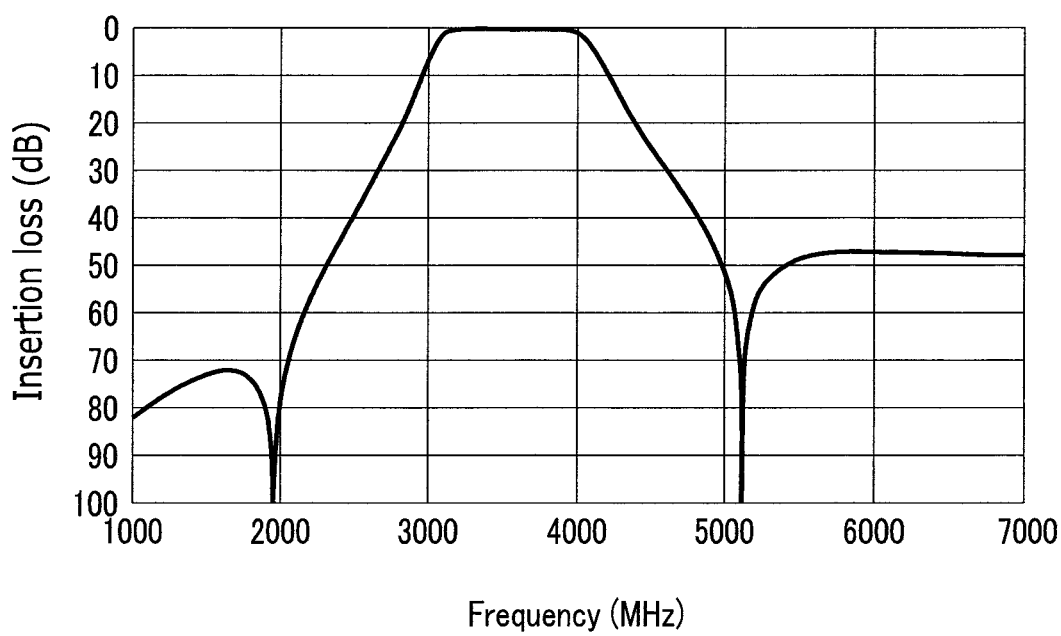
FIG. 14 is a characteristic diagram showing the pass characteristics of a third model of the band-pass filter.

FIG. 14 shows the pass characteristic of the third model. In FIG. 14, the horizontal axis represents frequency, and the vertical axis represents insertion loss. It is found from FIG. 14 and the pass characteristic of the first model (the magnetic coupling coefficients k13 and k24 of the jump-coupling each are 0) shown in FIG. 12 that an attenuation pole is formed in a frequency range lower than the pass band of the band-pass filter, due to the jump-coupling between the first resonator 21 and the third resonator 23. In the present embodiment, as described above, the jump-coupling between the third resonator 23 and the first resonator 21 allows formation of the attenuation pole in the first vicinity range.

Next, the pass characteristic of the fourth model will be described. In the fourth model, the magnetic coupling coefficient k23 was set at 0.37. The magnetic coupling coefficient k13 of jump-coupling was 0, and the magnetic coupling coefficient k24 of the jump-coupling was set at 0.02.

Figure 15:
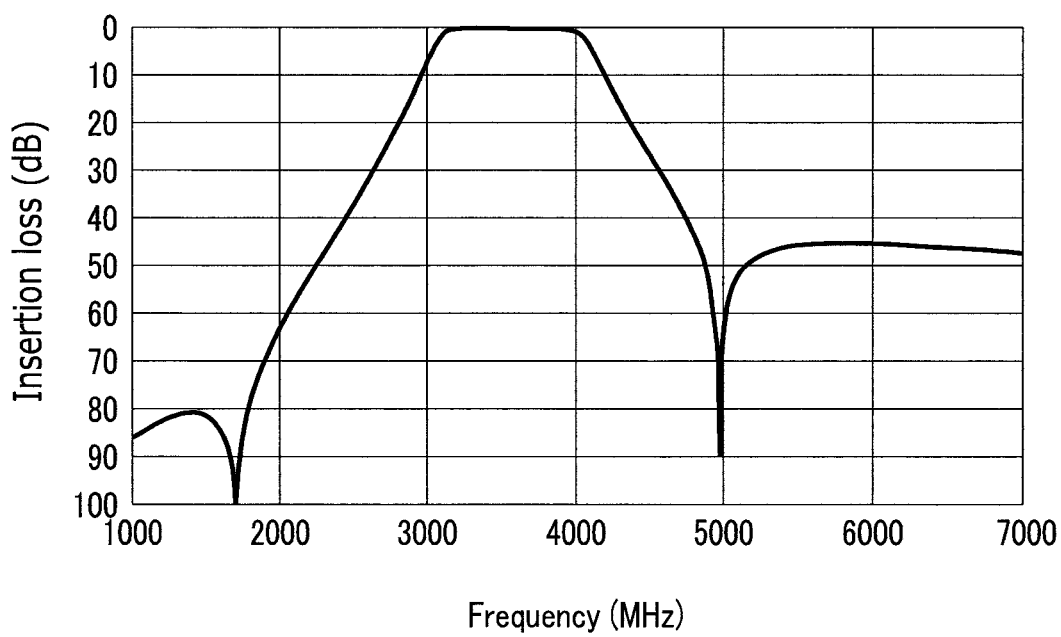
FIG. 15 is a characteristic diagram showing the pass characteristics of a fourth model of the band-pass filter.

FIG. 15 shows the pass characteristic of the fourth model. In FIG. 15, the horizontal axis represents frequency, and the vertical axis represents insertion loss. It is found from FIG. 15 and the pass characteristic of the first model (the magnetic coupling coefficients k13 and k24 of the jump-coupling each are 0) shown in FIG. 12 that an attenuation pole is formed in a frequency range lower than the pass band of the band-pass filter, due to the jump-coupling between the second resonator 22 and the fourth resonator 24. In the present embodiment, as described above, the jump-coupling between the fourth resonator 24 and the second resonator 22 allows formation of the attenuation pole in the first vicinity range.

Next, the pass characteristic of the fifth model will be described. In the fifth model, the magnetic coupling coefficient k23 was set at 0.37. The magnetic coupling coefficient k13 of jump-coupling was 0.032, and the magnetic coupling coefficient k24 of the jump-coupling was set at 0.02.

Figure 16:
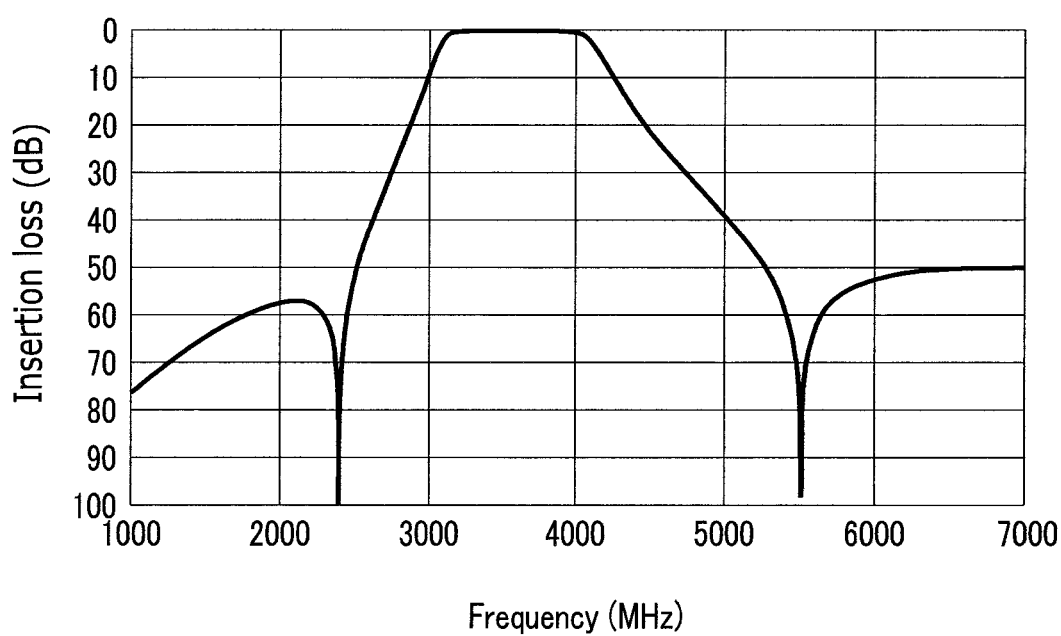
FIG. 16 is a characteristic diagram showing the pass characteristics of a fifth model of the band-pass filter.

FIG. 16 shows the pass characteristic of the fifth model. In FIG. 16, the horizontal axis represents frequency, and the vertical axis represents insertion loss. It is found from FIG. 16, the pass characteristic of the third model (the magnetic coupling coefficient k24 is 0) shown in FIG. 14, and the pass characteristic of the fourth model (the magnetic coupling coefficient k13 is 0) shown in FIG. 15, that attenuation pole formed by the jump-coupling of the two pairs of resonators becomes abrupter than the attenuation pole formed by the jump-coupling of the one pair of resonators shown in FIGS. 14 and 15. This is because of synergy between the effect of the jump-coupling of one pair of resonators and the effect of the jump-coupling of the other pair of resonators. In the present embodiment, the jump-coupling of the two pairs of resonators makes the attenuation pole formed in the first vicinity range abrupter.

As is understood from the simulation results shown in FIGS. 12 to 16, according to the present embodiment, it is possible to form an abrupt attenuation pole in each of the first and second vicinity ranges, with the use of the magnetic coupling between the second resonator 22 and the third resonator 23 as the main coupling and the use of at least one of the jump-coupling between the first resonator 21 and the third resonator 23 and the jump-coupling between the second resonator 22 and the fourth resonator 24. In the present embodiment, it is possible to form an abrupter attenuation pole in the first vicinity range, with the use of both of the jump-coupling between the first resonator 21 and the third resonator 23 and the jump-coupling between the second resonator 22 and the fourth resonator 24.

In the present embodiment, the distance between the second resonator 22 and the third resonator 23 is made shorter than that between the first resonator 21 and the second resonator 22, and shorter than that between the third resonator 23 and the fourth resonator 24. Specifically in the present embodiment, the capacitive coupling between the second resonator 22 and the third resonator 23 is made relatively strong while the magnetic coupling between the second resonator 22 and the third resonator 23 is made relatively strong by making the distance between the second resonator 22 and the third resonator 23 relatively short. Thus, the attenuation pole formed in the second vicinity range has a frequency close to the pass band. Therefore, according to the present embodiment, it is possible to achieve a characteristic for abruptly varying the insertion loss in the vicinity of the pass band. Note that a second embodiment will describe an example in which the distance between the second resonator 22 and the third resonator 23 is made longer than that of the present embodiment.

According to the present embodiment, it is possible to form the attenuation pole as described above while satisfying balance characteristics. This effect will be described later with reference to an example of characteristic of the band-pass filter 1.

In the present embodiment, each of the second to fourth resonators 22 to 24 is a resonator with both ends open. The resonator with both ends open is able to have a symmetrical circuit configuration with respect to the center of the resonator. As shown in FIG. 1, the present embodiment has a symmetrical circuit configuration in which a group of the capacitors C2A, C3A, C4A, C23A, and C34A and a group of the capacitors C2B, C3B, C4B, C23B, and C34B are symmetrical with respect to the second to fourth resonators 22 to 74.

Respective ends of the resonator with both ends open are referred to as a first end and a second end. In the resonator with both ends open, when the balance of an electric field and a magnetic field between the side of the first end and the side of the second end is lost, the balance characteristics deteriorate. In the present embodiment, providing the fourth resonator 24 improves the symmetry of the circuit configuration of the band-pass filter 1, as compared with the case of having no fourth resonator 24. Therefore, according to the present embodiment, it is possible to improve the balance characteristics by relieving unbalance of the electric field and the magnetic field.

Next, examples of characteristics of the band-pass filter 1 according to the present embodiment will be described with reference to FIGS. 17 to 22. Here, the examples of characteristics of the band-pass filter 1 that is designed such that the pass band includes a frequency band of 3.3 GHz to 3.9 GHz will be described.

Figure 17:
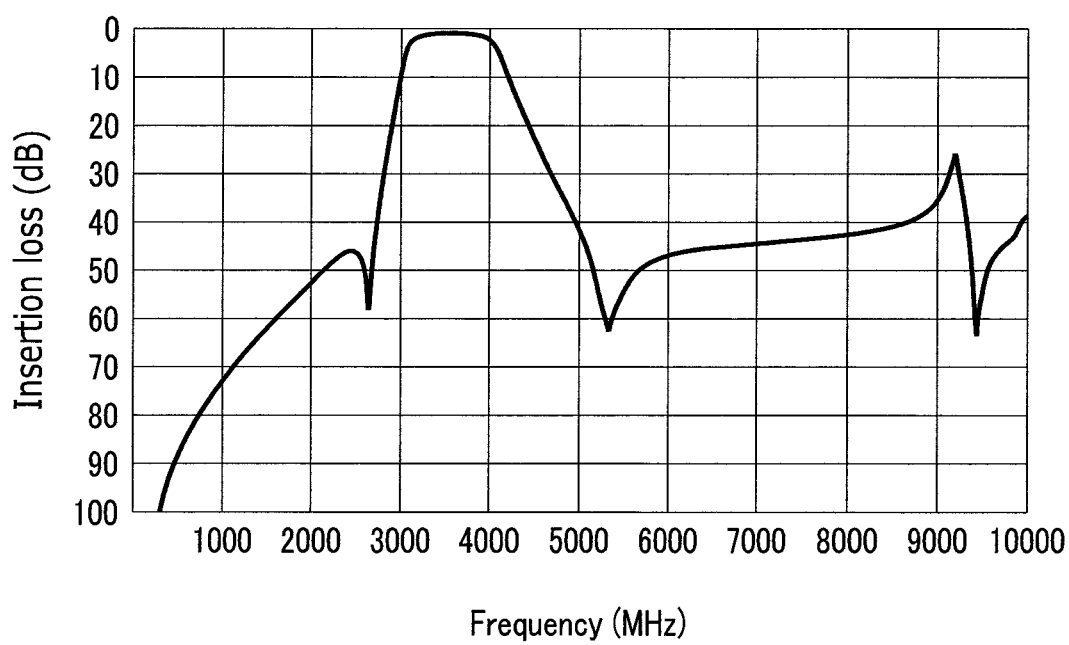
FIG. 17 is a characteristic diagram showing an example of pass characteristic of the band-pass filter according to the first embodiment of the invention.
Figure 18:
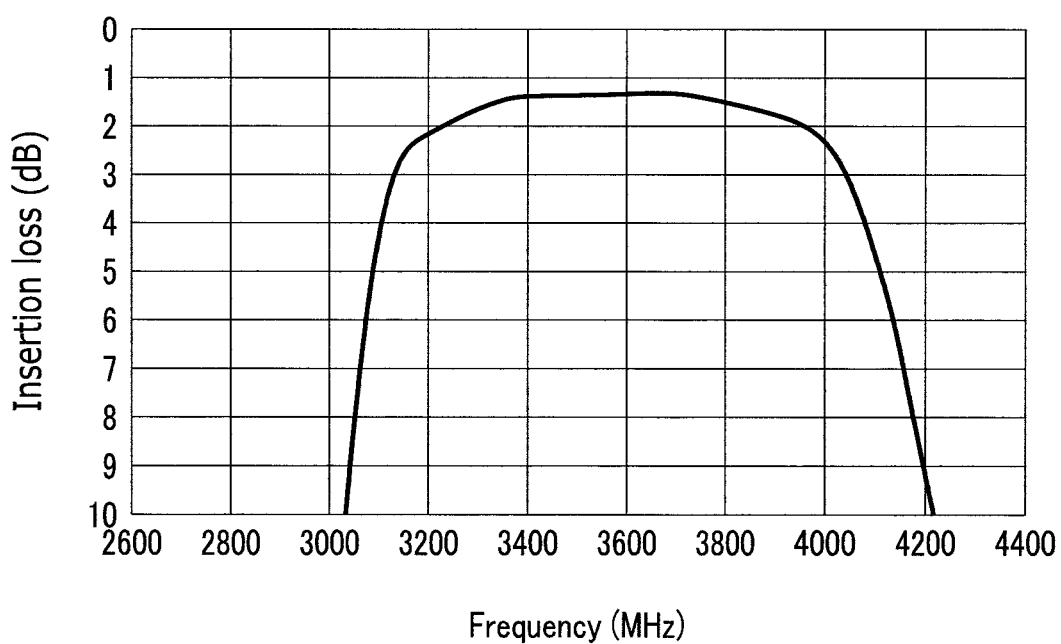
FIG. 18 is a characteristic diagram showing a portion of FIG. 17 on an enlarged scale.

FIG. 17 shows an example of pass characteristic of the band-pass filter 1. FIG. 18 shows part of FIG. 17 on an enlarged scale. Here, the foregoing insertion loss is indicated as the pass characteristic of the band-pass filter 1. In each of FIGS. 17 and 18, the horizontal axis represents frequency, and the vertical axis represents insertion loss. It is found from FIG. 17 that in the band-pass filter 1, an attenuation pole at which the insertion loss abruptly varies is formed in each of first and second vicinity ranges.

The insertion loss is preferably 2.5 dB or less. As shown in FIG. 18, the band-pass filter 1 has the insertion loss of 2.5 dB or less in the foregoing frequency bands.

Figure 19:
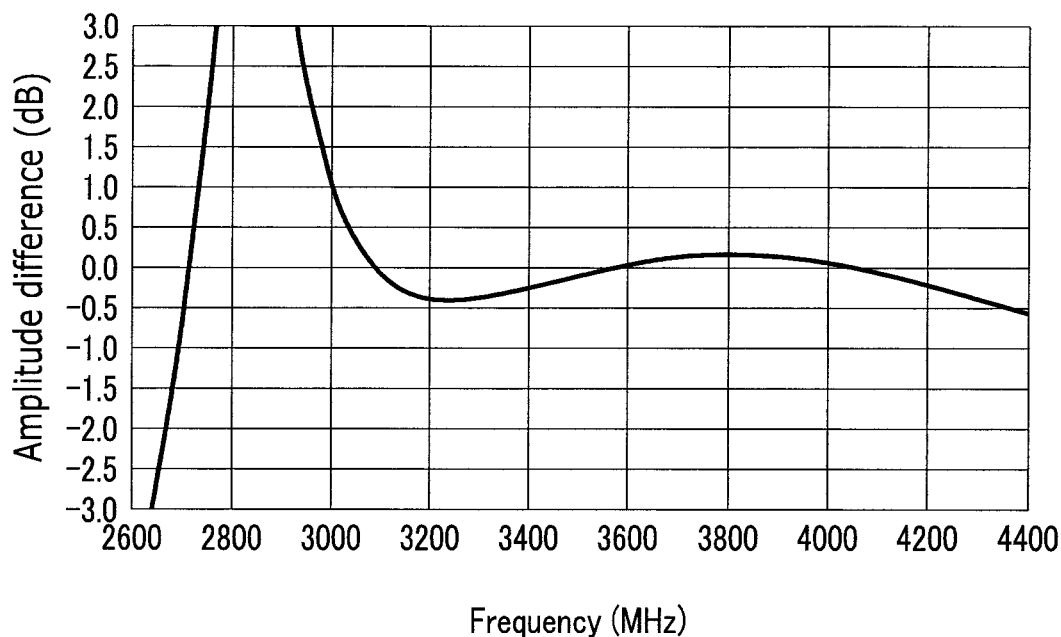
FIG. 19 is a characteristic diagram showing an example of amplitude balance characteristic of the band-pass filter according to the first embodiment of the invention.

FIG. 19 shows an example of amplitude balance characteristic of the band-pass filter 1. The amplitude balance characteristic of the band-pass filter 1 is represented here using a difference in amplitude between the first and second balanced element signals outputted from the first and second balanced ports 12 and 13 upon input of an unbalanced signal to the unbalanced port 11, which will hereinafter be simply referred to as the amplitude difference. The amplitude difference is expressed in positive values when the amplitude of the first balanced element signal is greater than the amplitude of the second balanced element signal, and in negative values when the amplitude of the first balanced element signal is smaller than the amplitude of the second balanced element signal. In FIG. 19, the horizontal axis represents frequency, and the vertical axis represents amplitude difference. With the amplitude difference denoted as in (dB), in preferably has a value of −1.5 or more and not more than 1.5, and more preferably −1.0 or more and not more than 1.0. As shown in FIG. 19, the band-pass filter 1 has an m value of −1.0 or more and not more than 1.0 in the foregoing frequency band.

Figure 20:
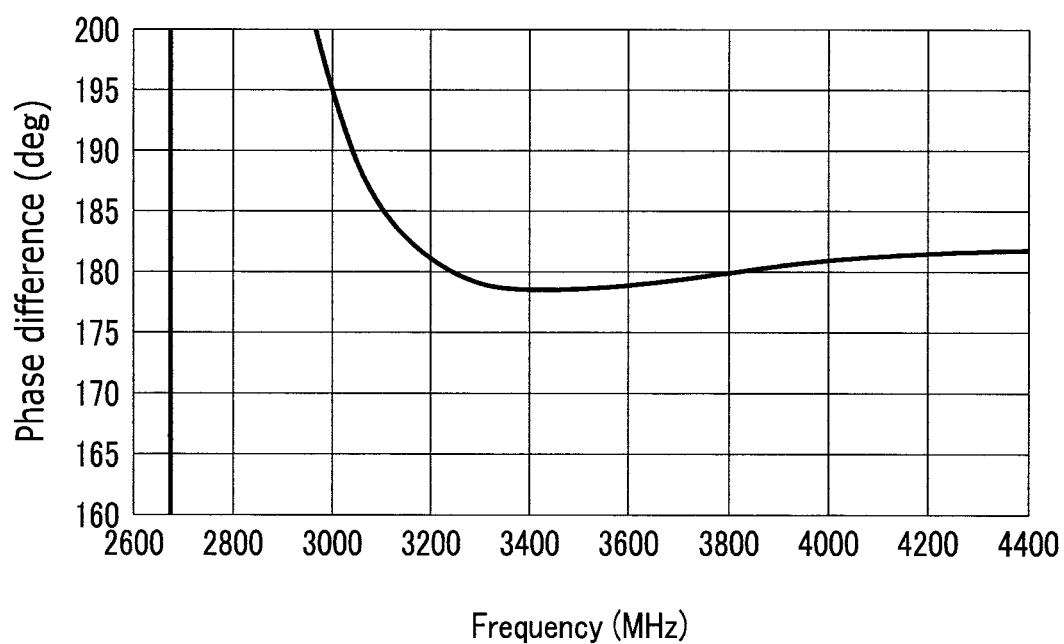
FIG. 20 is a characteristic diagram showing an example of phase balance characteristic of the band-pass filter according to the first embodiment of the invention.

FIG. 20 shows an example of phase balance characteristic of the band-pass filter 1. The phase balance characteristic of the band-pass filter 1 is represented here using a difference in phase between the first and second balanced element signals outputted from the first and second balanced ports 12 and 13 upon input of an unbalanced signal to the unbalanced port 11, which will hereinafter be simply referred to as the phase difference. The phase difference represents the magnitude of advancement of the phase of the first balanced element signal relative to the phase of the second balanced element signal. In FIG. 20, the horizontal axis represents frequency, and the vertical axis represents phase difference. With the phase difference denoted as p (deg), p preferably has a value of 165 or more and not more than 196. As shown in FIG. 20, the band-pass filter 1 has a p value of 165 or more and not more than 195 in the foregoing frequency band.

Figure 21:
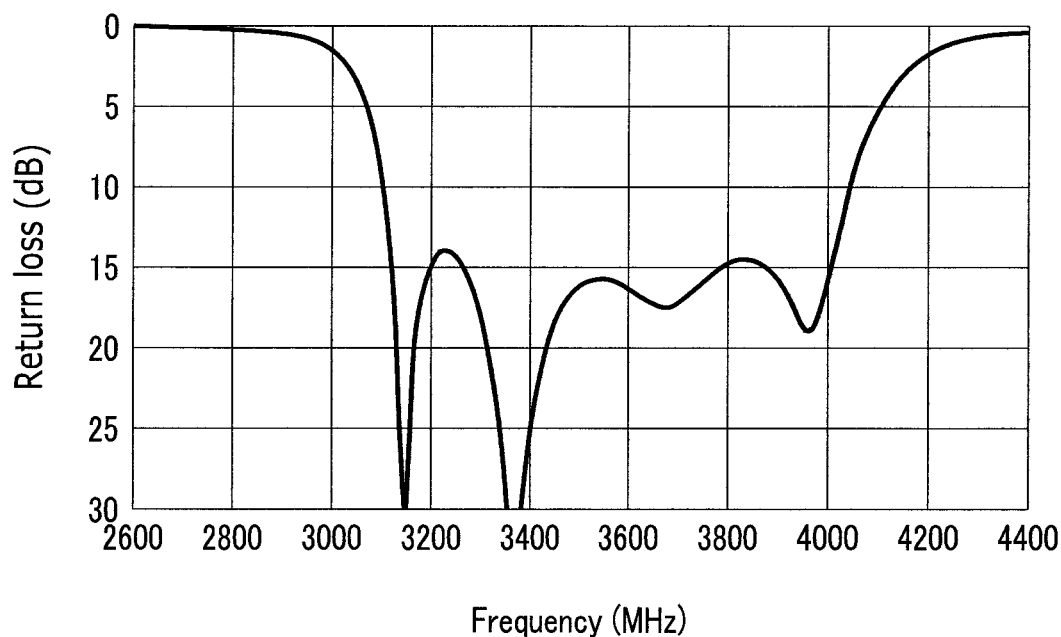
FIG. 21 is a characteristic diagram showing an example of reflection characteristic of the unbalanced port of the band-pass filter according to the first embodiment of the invention.
Figure 22:
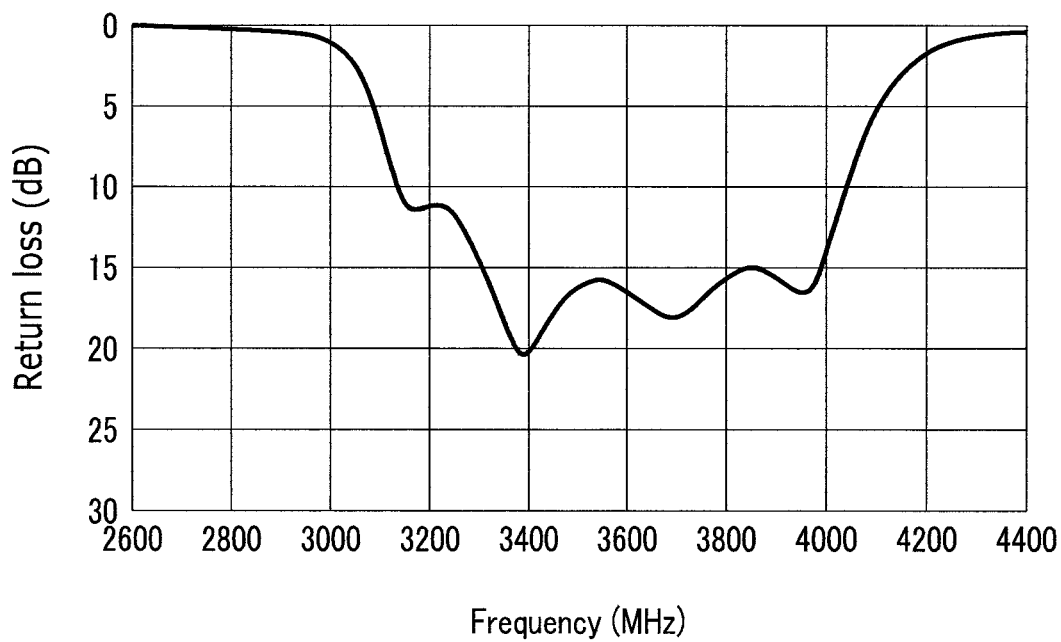
FIG. 22 is a characteristic diagram showing an example of pass characteristic of the first and second balanced ports of the band-pass filter according to the first embodiment of the invention.

FIG. 21 shows an example of reflection characteristic of the unbalanced port 11 of the band-pass filter 1. FIG. 22 shows an example of reflection characteristic of the first and second balanced ports 12 and 13 of the band-pass filter 1. In each of FIGS. 21 and 22, the horizontal axis represents frequency, and the vertical axis represents return loss. The return loss is preferably 10 dB or more. As shown in FIGS. 21 and 22, the band-pass filter 1 has the return loss of 10 dB or more in the foregoing frequency band.

As described above, the band-pass filter 1 having the characteristics shown in FIGS. 17 to 22 is usable in at least the frequency band of 3.3 GHz to 3.9 GHz, and has the favorable balance characteristics in this frequency band. As is understood from FIGS. 17 to 22, the band-pass filter 1 can form the abrupt attenuation pole in each of the first and second vicinity ranges while satisfying the balance characteristics.

Second Embodiment

Figure 23:
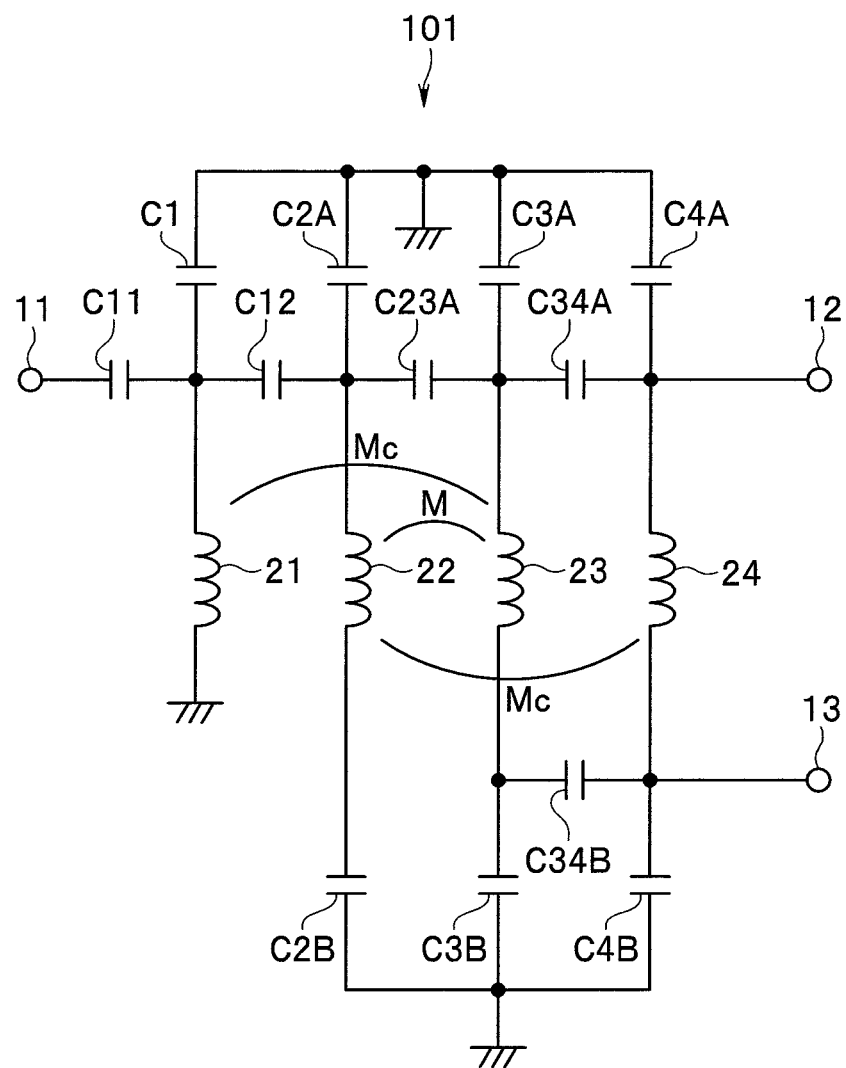
FIG. 23 is a circuit diagram showing the circuit configuration of a band-pass filter according to a second embodiment of the invention.

A second embodiment of the invention will now be described. First, the circuit configuration of a band-pass filter according to the present embodiment will be described in brief with reference to FIG. 23. FIG. 23 shows the circuit configuration of the band-pass filter according to the present embodiment.

The circuit configuration of a band-pass filter 101 according to the present embodiment is different from that of the band-pass filter 1 according to the first embodiment in the following respect. In the present embodiment, there is no capacitor C23B provided for connecting one end of the second resonator 22 on the side of the capacitor C2B to one end of the third resonator 23 on the side of the capacitor C3B. The other circuit configuration of the band-pass filter 101 is the same as that of the band-pass filter 1 according to the first embodiment.

Figure 24:
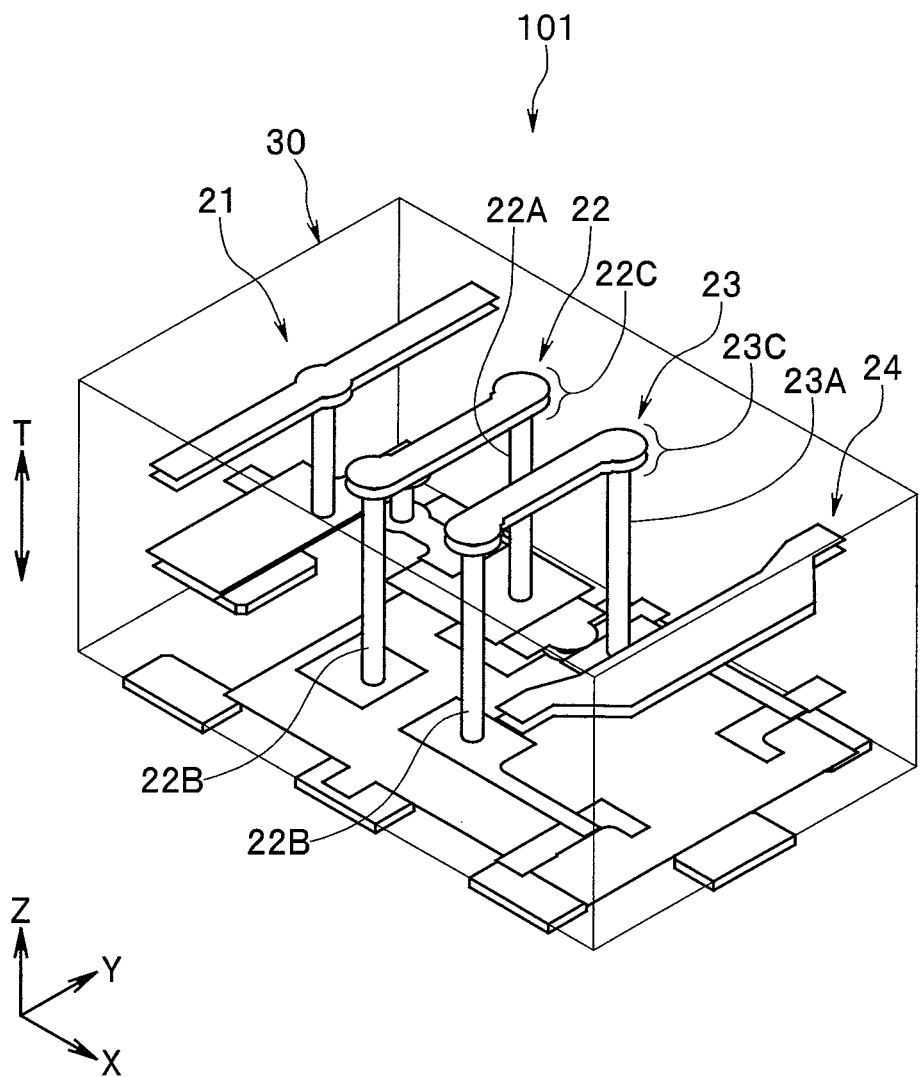
FIG. 24 is a perspective view showing the interior of the hand-pass filter according to the second embodiment of the invention.

Next, a structure of the band-pass filter 101 will be described. FIG. 24 is a perspective view showing the interior of the band-pass filter 101. Just as with the band-pass filter 1 according to the first embodiment, the band-pass filter 101 includes the stack 30 and the first to eights terminals 111 to 118 (refer to FIGS. 2 and 3). The stack 30 of the present embodiment integrates the ports 11 to 13, the first to fourth resonators 21 to 24, and the capacitors C1, C2A, C2B, C3A, C3B, C4A, C4B, C11, C12, C23A, C34A, and C34B. The shape and layout of the first to eighth terminals 111 to 118 are the same as those of the first embodiment.

The stack 30 of the present embodiment will be described in detail with reference to FIG. 25A to FIG. 32B. In the present embodiment, the stack 30 includes stacked twenty-five dielectric layers instead of the dielectric layers 31 to 56 of the first embodiment. The twenty-five dielectric layers will be referred to as the first to twenty-fifth dielectric layers in the order from bottom to top. The first to twenty-fifth dielectric layers will be denoted by the reference numerals 61 to 85.

Figure 25A:
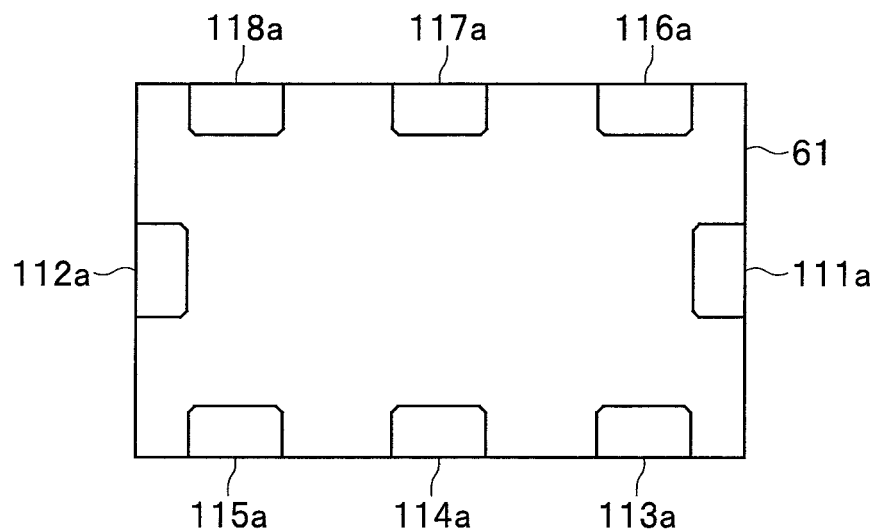
FIG. 25A and FIG. 25B are explanatory diagrams showing respective patterned surfaces of first and second dielectric layers of the stack of the band-pass filter according to the second embodiment of the invention.

FIG. 25A shows the patterned surface of the first dielectric layer 61. FIG. 25A shows terminal parts 111a to 118a constituting parts of the terminals 111 to 118, respectively.

Figure 25B:
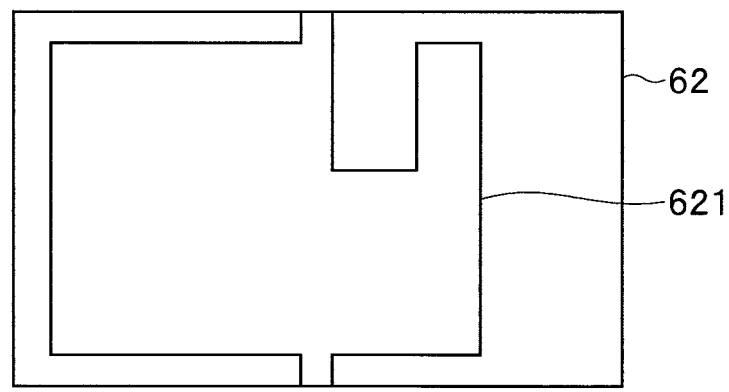

FIG. 25B shows the patterned surface of the second dielectric layer 62. A ground conductor layer 621 is formed on the patterned surface of the dielectric layer 62. The conductor layer 621 is connected to the fourth and seventh terminals 114 and 117.

Figure 26A:
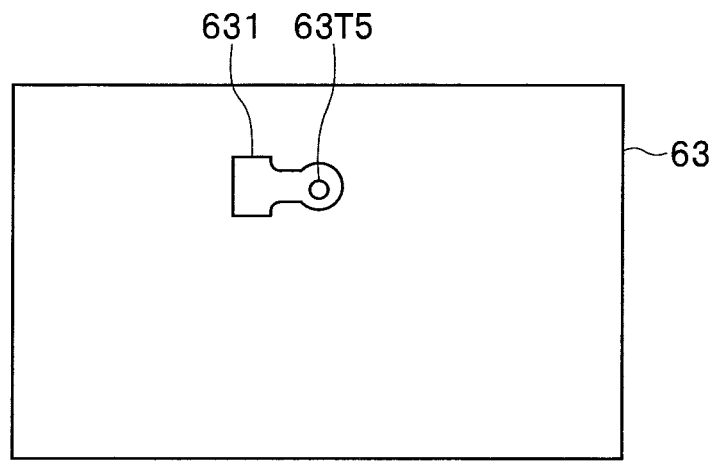
FIG. 26A and FIG. 26B are explanatory diagrams showing respective patterned surfaces of third and fourth dielectric layers of the stack of the band-pass filter according to the second embodiment of the invention.

FIG. 26A shows the patterned surface of the third dielectric layer 63. A conductor layer 631 is formed on the patterned surface of the dielectric layer 63. Further, through hole 63T5 is formed in the dielectric layer 63. The through hole 6315 is connected to the conductor layer 631.

Figure 26B:
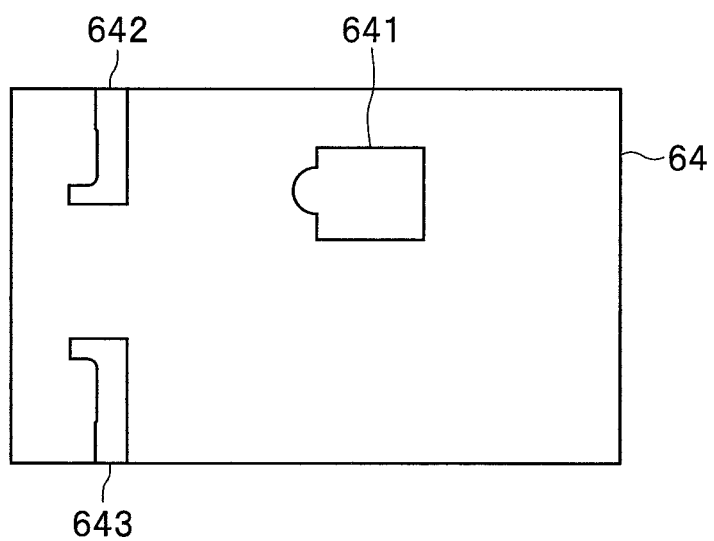

FIG. 26B shows the patterned surface of the fourth dielectric layer 64. A conductor layers 641, 642 and 643 are formed on the patterned surface of the dielectric layer 63. The through hole 63T5 formed in the third dielectric layer 63 is connected to the conductor layer 641. The conductor layer 632 is connected to the eighth terminal 118. The conductor layer 633 is connected to the fifth terminal 115.

Figure 27A:
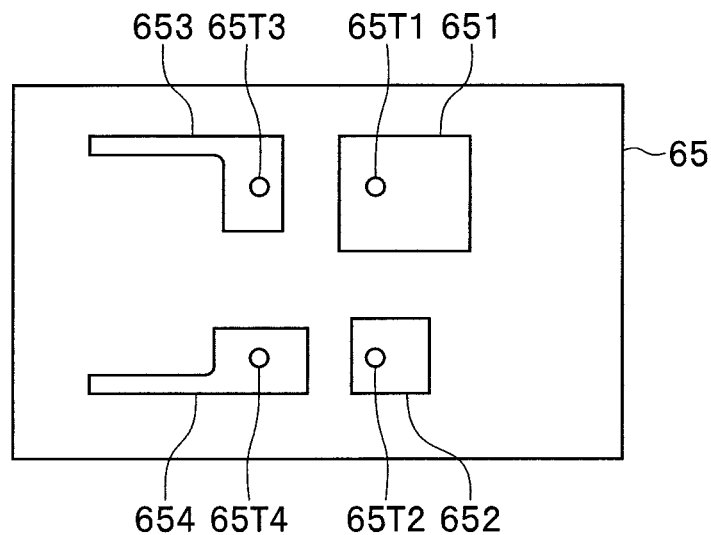
FIG. 27A and FIG. 27B are explanatory diagrams showing respective patterned surfaces of fifth and sixth dielectric layers of the stack of the band-pass filter according to the second embodiment of the invention.
Figure 27B:
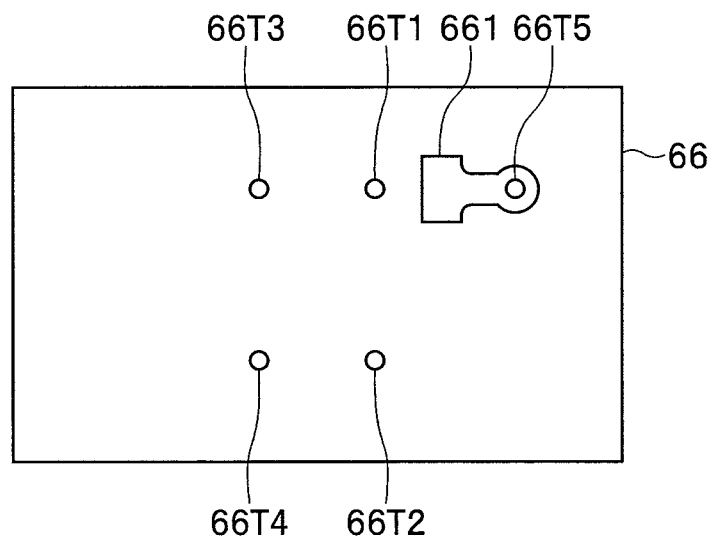

FIG. 27A shows the patterned surface of the fifth dielectric layer 65. A conductor layers 651, 652, 653 and 654 are formed on the patterned surface of the dielectric layer 65. Further, through holes 65T1, 65T2, 65T3 and 65T4 are formed in the dielectric layer 65. The through holes 65T1, 65T2, 65T3 and 651 are connected to the conductor layers 651, 652, 653 and 654, respectively, FIG. 27B shows the patterned surface of the sixth dielectric layer 66. A conductor layer 661 is formed on the patterned surface of the dielectric layer 66. Further, through holes 66T1, 66T2, 66T3, 66T4 and 66T5 are formed in the dielectric layer 66. The through holes 65T1, 65T2, 65T3 and 65T4 formed in the fifth dielectric layer 65 are connected to the through holes 66T1, 66T2, 66T3 and 66T4, respectively. The through hole 6615 is connected to the conductor layer 661.

Figure 28A:
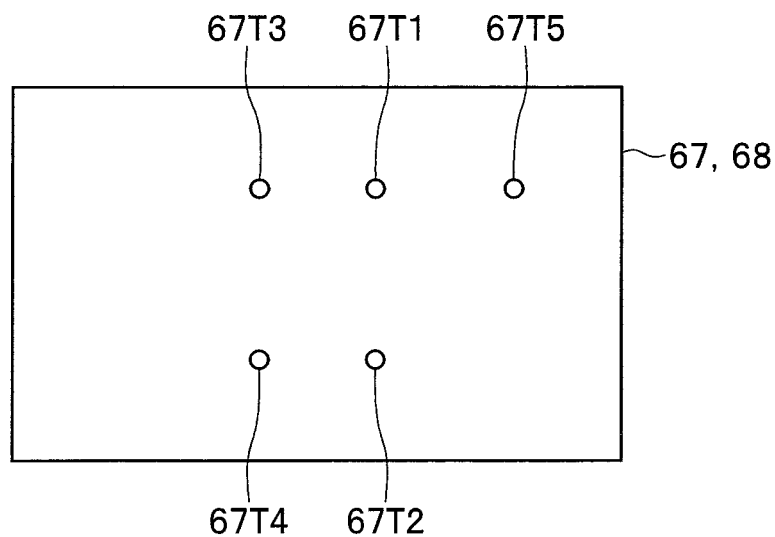
FIG. 28A is an explanatory diagram showing a patterned surface of each of a seventh and a eighth dielectric layer of the stack of the band-pass filter according to the second embodiment of the invention.

FIG. 28A shows the patterned surface of each of the seventh and eighth dielectric layers 67 and 68. In each of the dielectric layers 67 and 68, there are formed through holes 67T1, 67T2, 67T3, 67T4 and 67T5. The through holes 66T1, 66T2, 66T3, 66T4 and 66T5 formed in the sixth dielectric layer 66 are connected to the through holes 67T1, 67T2, 67T3, 67T4 and 67T5 formed in the seventh dielectric layer 67, respectively. In the dielectric layers 67 and 68, every vertically adjacent through holes denoted by the same reference signs are connected to each other.

Figure 28B:
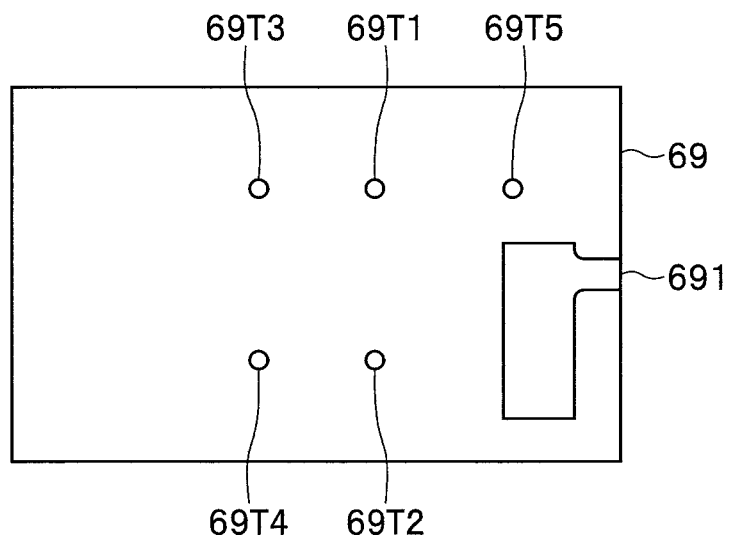
FIG. 28B is an explanatory diagram showing a patterned surface of a ninth dielectric layer of the stack of the band-pass filter according to the second embodiment of the invention.

FIG. 28B shows the patterned surface of the ninth dielectric layer 69. A conductor layer 691 is formed on the patterned surface of the dielectric layer 69. Further, through holes 69T1, 69T2, 69T3, 69T4 and 69T5 are formed in the dielectric layer 69. The through holes 67T1, 67T2, 67T3, 67T4 and 67T5 formed in the eighth dielectric layer 68 are connected to the through holes 69T1, 69T2, 69T3, 69T4 and 69T5, respectively.

Figure 29A:
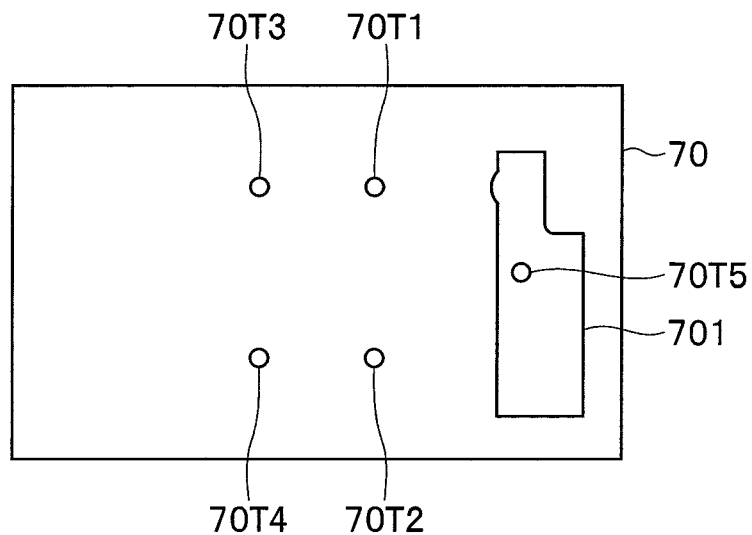
FIG. 29A is an explanatory diagram showing a patterned surface of a tenth dielectric layer of the stack of the band-pass filter according to the second embodiment of the invention.
Figure 29B:
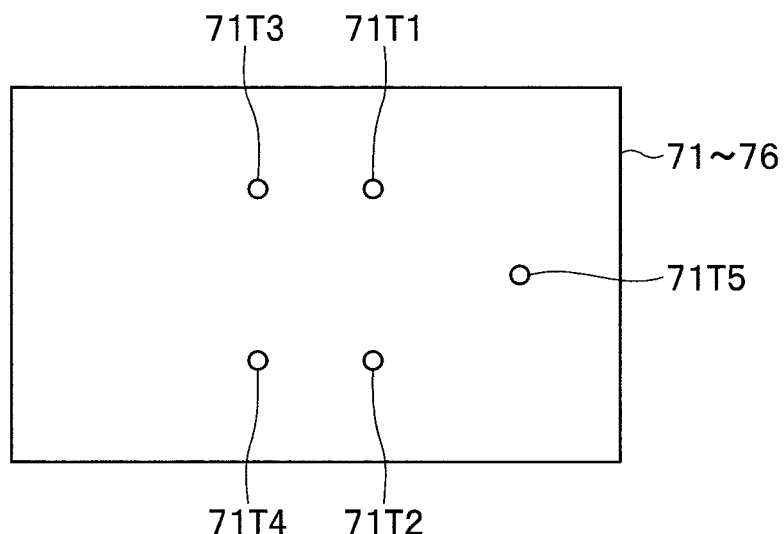
FIG. 29B is an explanatory diagram showing a patterned surface of each of a eleventh and a sixteenth dielectric layer of the stack of the band-pass filter according to the second embodiment of the invention.

FIG. 29A shows the patterned surface of the tenth dielectric layer 70. A conductor layer 701 is formed on the patterned surface of the dielectric layer 70. Further, through holes 70T1, 70T2, 70T3, 70T4 and 70T5 are formed in the dielectric layer 70. The through holes 69T1, 69T2, 69T3 and 69T4 formed in the ninth dielectric layer 69 are connected to the through holes 70T1, 70T2, 70T3 and 70T4, respectively. The through hole 70T5 and the through hole 69T5 formed in the ninth dielectric layer 69 are connected to the conductor layer 701.

FIG. 29A shows the patterned surface of each of the eleventh to sixteenth dielectric layers 71 to 76. In each of the dielectric layers 71 to 76, there are formed through holes 71T1, 71T2, 71T3, 71T4 and 71T5. The through holes 70T1, 70T2, 70T3, 70T4 and 70T5 formed in the tenth dielectric layer 70 are connected to the through holes 71T1, 71T2, 71T3, 71T4 and 71T5 formed in the eleventh dielectric layer 71, respectively. In the dielectric layers 71 to 76, every vertically adjacent through holes denoted by the same reference signs are connected to each other.

Figure 30A:
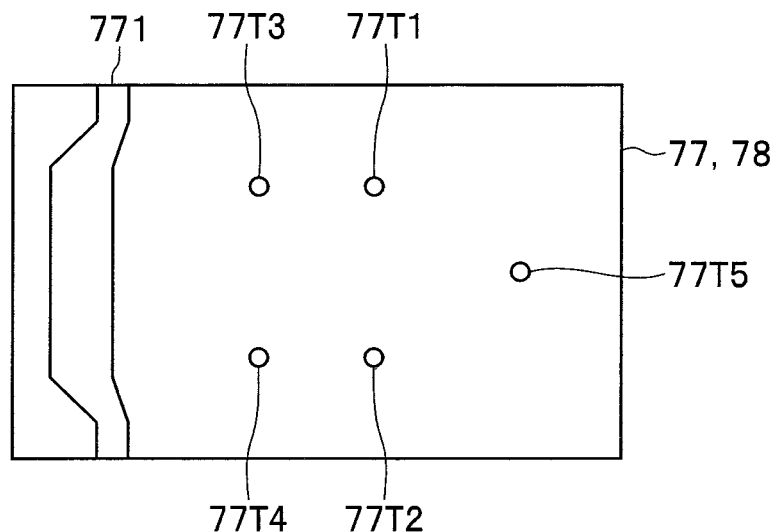
FIG. 30A is an explanatory diagram showing a patterned surface of each of a seventeenth and a eighteenth dielectric layer of the stack of the band-pass filter according to the second embodiment of the invention.

FIG. 30A shows the patterned surface of each of the seventeenth and eighteenth dielectric layers 77 and 78. A resonator-forming conductor layer 771 is formed on the patterned surface of each of the dielectric layers 77 and 78. The resonator-forming conductor layer 771 is connected to the fifth and eighth terminals 115 and 118. Further, in each of the dielectric lavers 77 and 78, there are formed through holes 77T1, 77T2, 77T3, 77T4 and 77T5. The through holes 71T1, 71T2, 71T3, 71T4 and 7115 formed in the sixteenth dielectric layer 76 are connected to the through holes 77T1, 77T2, 77T3, 77T4 and 77T5 formed in the seventeenth dielectric layer 77, respectively. In the dielectric layers 77 and 78, every vertically adjacent through holes denoted by the same reference signs are connected to each other.

Figure 30B:
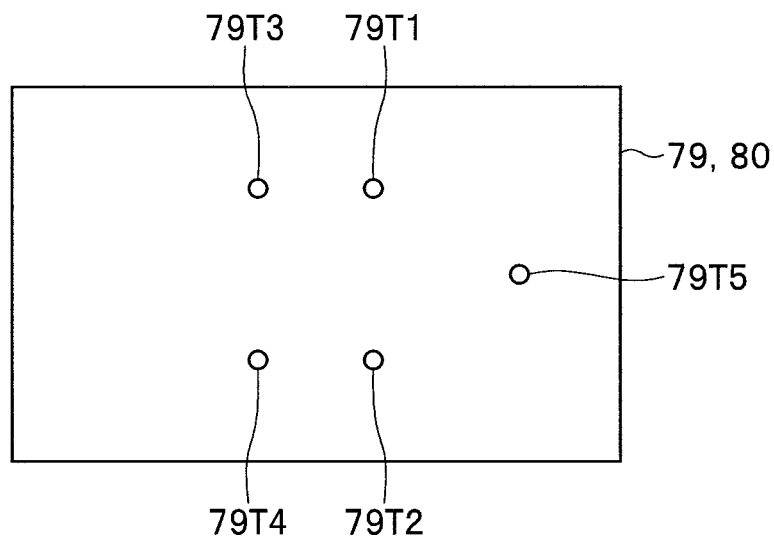
FIG. 30B is an explanatory diagram showing a patterned surface of each of a nineteenth and a twentieth dielectric layer of the stack of the band-pass filter according to the second embodiment of the invention.

FIG. 30B shows the patterned surface of each of the nineteenth and twentieth dielectric layers 79 and 80. In each of the dielectric layers 77 and 87, there are formed through holes 79T1, 79T2, 79T3, 79T4 and 79T5. The through holes 77T1, 77T2, 77T3, 77T4 and 77T5 formed in the eighteenth dielectric layer 78 are connected to the through holes 79T1, 79T2, 79T3, 79T4 and 79T5 formed in the nineteenth dielectric layer 79, respectively. In the dielectric layers 79 and 80, every vertically adjacent through holes denoted by the same reference signs are connected to each other.

Figure 31A:
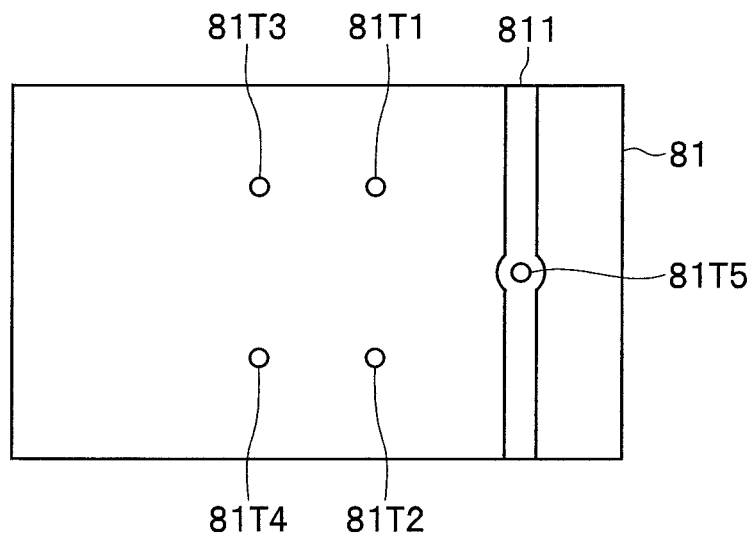
FIG. 31A and FIG. 31B are explanatory diagrams showing respective patterned surfaces of twenty-first and twenty-second dielectric layers of the stack of the band-pass filter according to the second embodiment of the invention.

FIG. 31A shows the patterned surface of the twenty-first dielectric layer 81. A resonator-forming conductor layer 811 is formed on the patterned surface of the dielectric layer 81. The resonator-forming conductor layer 811 is connected to the third and sixth terminals 113 and 116. Further, through holes 81T1, 81T2, 81T3, 81T4 and 81T5 are formed in the dielectric layer 81. The through holes 79T1, 79T2, 79T3 and 79T4 formed in the twentieth dielectric layer 70 are connected to the through holes 81T1, 81T2, 81T3 and 81T4, respectively.

Figure 31B:
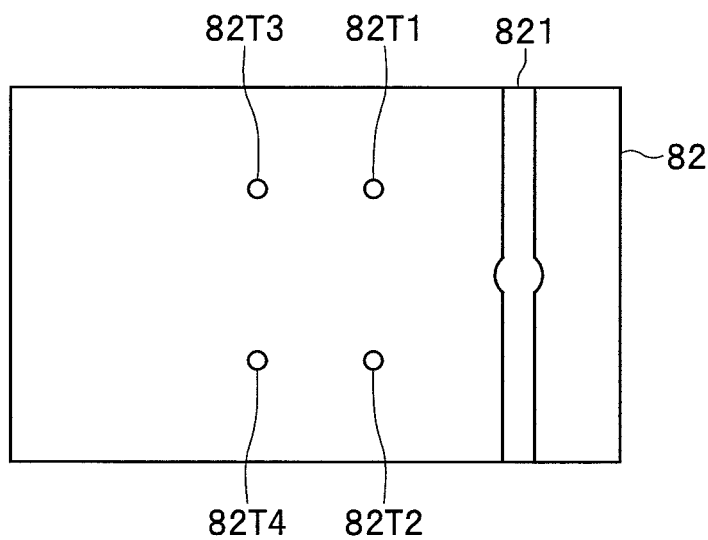

FIG. 31B shows the patterned surface of the twenty-second dielectric layer 54. A resonator-forming conductor layer 821 is formed on the patterned surface of the dielectric layer 82. The resonator-forming conductor layer 821 is connected to the third and sixth terminals 113 and 116. The through hole 81T5 formed in the twenty-first dielectric layer 81 is connected to part of the resonator-forming conductor layer 821, i.e. a portion including the middle of the resonator-forming conductor layer 821 in a longitudinal direction. Further, through holes 82T1, 82T2, 82T3, 82T4 and 82T5 are formed in the dielectric layer 82. The through holes 81T1, 81T2, 81T3 and 81T4 formed in the dielectric layer 81 are connected to the through holes 82T1, 82T2, 82T3 and 82T4, respectively.

Figure 32A:
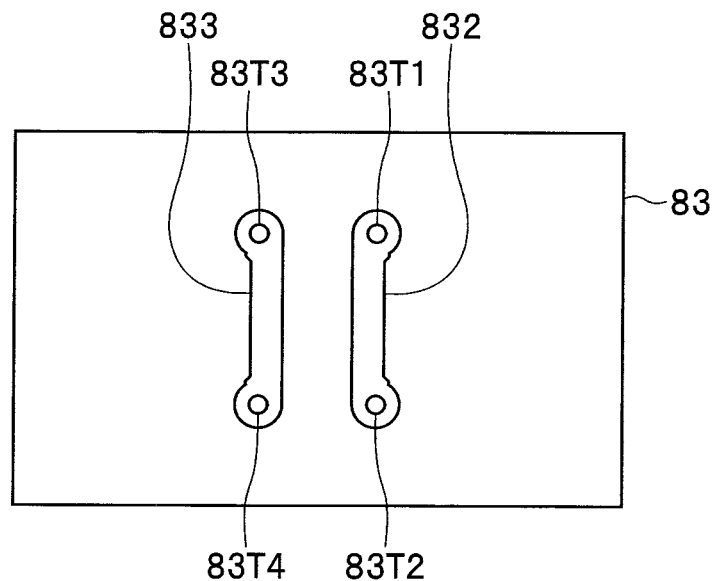
FIG. 32A and FIG. 32B are explanatory diagrams showing respective patterned surfaces of twenty-third and twenty-fourth dielectric layers of the stack of the band-pass filter according to the second embodiment of the invention.

FIG. 32A shows the patterned surface of the twenty-third dielectric layer 83. Resonator-forming conductor layers 832 and 833 are formed on the patterned surface of the dielectric layer 83. Each of the resonator-forming conductor layers 832 and 833 has a first end and a second end opposite to each other. Further, through holes 83T1, 83T2, 83T3 and 83T4 are formed in the dielectric layer 83. The through hole 83T1 and the through hole 82T1 formed in the twenty-second dielectric layer 82 are connected to a portion of the resonator-forming conductor layers 832 near the first end thereof. The through hole 83T2 and the through hole 82T2 formed in the dielectric layer 82 are connected to a portion of the resonator-forming conductor layers 832 near the second end thereof. The through hole 83T3 and the through hole 82T3 formed in the dielectric layer 82 are connected to a portion of the resonator-forming conductor layers 833 near the first end thereof. The through hole 83T4 and the through hole 82T4 formed in the dielectric layer 82 are connected to a portion of the resonator-forming conductor layers 833 near the second end thereof.

Figure 32B:
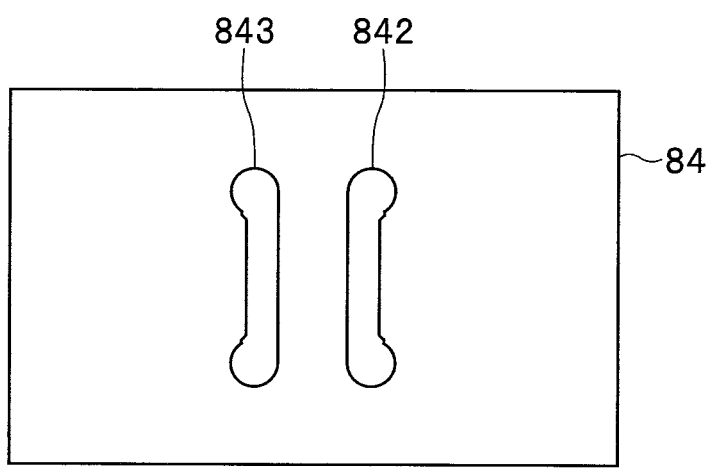

FIG. 32B shows the patterned surface of the twenty-fourth dielectric layer 84. Resonator-forming conductor layer 842 and 843 are formed on the patterned surface of the dielectric layer 84. Each of the resonator-forming conductor layers 842 and 843 has a first end and a second end opposite to each other. The through hole 83T1 formed in the twenty-third dielectric layer 83 is connected to a portion of the resonator-forming conductor layers 842 near the first end thereof. The through hole 83T2 formed in the dielectric layer 83 is connected to a portion of the resonator-forming conductor layers 842 near the second end thereof. The through hole 83T3 formed in the dielectric layer 83 is connected to a portion of the resonator-forming conductor layers 843 near the first end thereof. The through hole 83T4 formed in the dielectric layer 83 is connected to a portion of the resonator-forming conductor layers 843 near the second end thereof.

Although it is not shown in the drawing, a mark may be formed in the patterned surface of the twenty-fifth dielectric layer 85.

The stack 30 of the present embodiment is formed by stacking the first to twenty-fifth dielectric layers 61 to 85 such that the patterned surface of the first dielectric layer 61 serves as the bottom surface 30B of the stack 30 (see FIGS. 2 and 3) and the surface of the twenty-sixth dielectric layer 85 opposite to the patterned surface thereof serves as the top surface 30A of the stack 30 (see FIGS. 2 and 3). The first to eighth terminals 111 to 118 are then formed on the periphery of the stack 30, whereby the band-pass filter 101 is completed.

A correspondence between the components of the band-pass filter 101 and the components inside the stack 30 shown in FIGS. 25A to 32B will be described below.

The first resonator 21 is formed of the resonator-forming conductor layers 811 and 821, the through holes 70T5 and 81T5, the through hole 71T5 formed in each of the dielectric layer 71 to 76, the through hole 77T5 formed in each of the dielectric layer 77 and 78, and the through hole 79T5 formed in each of the dielectric layers 79 and 80.

The second resonator 22 is formed of the resonator-forming conductor layers 832 and 842, the through holes 65T1, 65T2, 66T1, 66T2, 69T1, 69T2, 70T1, 70T2, 81T1, 81T2, 82T1, 82T2, 83T1 and 83T2, the through holes 67T1 and 67T2 formed in each of the dielectric layer 67 and 68, the through holes 71T1 and 71T2 formed in each of the dielectric layer 71 to 76, the through holes 77T1 and 77T2 formed in each of the dielectric layer 77 and 78, and the through holes 79T1 and 79T2 formed in each of the dielectric lavers 79 and 80.

Like the first embodiment, the second resonator 22 includes a first through hole line 22A, a second through hole line 22B, and a conductor layer portion 22C (see FIG. 24). The first through hole line 22A is formed of the through holes 65T1, 66T1, 69T1, 70T1, 81T1, and 82T1, the through holes 67T1 formed in each of the dielectric layers 67 and 68, the through holes 71T1 formed in each of the dielectric layers 71 to 76, the through holes 77T1 formed in each of the dielectric layers 77 and 78, and the through holes 79T1 formed in each of the dielectric layers 79 and 80 connected in series. The first through hole line 22A penetrates the dielectric layers 65 to 82.

The second through hole line 22B is formed of the through holes 65T2, 66T2, 69T2, 70T2, 81T2, and 82T2, the through holes 67T2 formed in each of the dielectric layers 67 and 68, the through holes 71T2 formed in each of the dielectric layers 71 to 76, the through holes 77T2 formed in each of the dielectric layers 77 and 78, and the through holes 79T2 formed in each of the dielectric layers 79 and 80 connected in series. The first through hole line 22A penetrates the dielectric layers 65 to 82.

The conductor layer portion 22C is formed of the resonator-forming conductor layers 832 and 842 that are connected to each other via the through holes 83T1 and 83T2.

The third resonator 23 is formed of the resonator-forming conductor layers 833 and 843, the through holes 65T3, 65T4, 66T3, 66T4, 69T3, 69T4, 70T3, 70T4, 81T3, 81T4, 82T3, 82T4, 83T3, and 83T4, the through holes 67T3 and 67T4 formed in each of the dielectric layer 67 and 68, the through holes 71T3 and 71T4 formed in each of the dielectric layer 71 to 76, the through holes 77T3 and 77T4 formed in each of the dielectric layer 77 and 78, and the through holes 79T3 and 79T4 formed in each of the dielectric layers 79 and 80.

Like the first embodiment, the third resonator 23 includes a first through hole line 23A, a second through hole line 23B, and a conductor layer portion 23C (see FIG. 24). The first through hole line 23A is formed of the through holes 65T3, 66T3, 69T3, 70T3, 81T3, and 82T3, the through holes 67T3 formed in each of the dielectric layers 67 and 68, the through holes 71T3 formed in each of the dielectric layers 71 to 76, the through holes 77T3 formed in each of the dielectric layers 77 and 78, and the through holes 79T3 formed in each of the dielectric layers 79 and 80 connected in series. The first through hole line 22A penetrates the dielectric layers 65 to 82.

The second through hole line 23B is formed of the through holes 65T4, 66T4, 69T4, 70T4, 81T4, and 82T4, the through holes 67T4 formed in each of the dielectric layers 67 and 68, the through holes 71T4 formed in each of the dielectric layers 71 to 76, the through holes 77T4 formed in each of the dielectric layers 77 and 78, and the through holes 79T4 formed in each of the dielectric layers 79 and 80 connected in series. The first through hole line 22A penetrates the dielectric layers 65 to 82.

The conductor layer portion 23C is formed of the resonator-forming conductor layers 833 and 843 that are connected to each other via the through holes 83T3 and 83T4.

The fourth resonator 24 is formed of the resonator-forming conductor layer 771 formed in each of the dielectric layer 77 and 78.

The capacitor C1 is formed of the conductor layers 621 and 701, and the dielectric layers 62 to 69 interposed between the conductor layers 621 and 701.

The capacitor C2A is formed of the conductor layers 621 and 651, and the dielectric layers 62 to 64 interposed between the conductor layers 621 and 651. The capacitor C2B is formed of the conductor layers 621 and 651, and the dielectric layers 62 to 64 interposed between the conductor layers 621 and 651.

The capacitor C3A is formed of the conductor layers 621 and 653, and the dielectric layers 62 to 64 interposed between the conductor layers 621 and 653. The capacitor C3B is formed of the conductor layers 621 and 654, and the dielectric layers 62 to 64 interposed between the conductor layers 621 and 654.

The capacitor C4A is formed of the conductor layers 621 and 642, and the dielectric layers 62 and 63 interposed between the conductor layers 621 and 642. The capacitor C4B is formed of the conductor layers 621 and 643, and the dielectric layers 62 and 63 interposed between the conductor layers 621 and 643.

The capacitor C11 is formed of the conductor layers 691 and 701, the dielectric layer 69 interposed between the conductor layers 691 and 701. The capacitor C12 is formed of the conductor layers 651 and 661, and the dielectric layer 65 interposed between the conductor layers 651 and 661.

The capacitor C23A is formed of the conductor layers 631, 641, 651 and 653, and the dielectric layers 63 and 64 interposed between the conductor layers 631 and 651, and the dielectric layer 64 interposed between the conductor layers 641 and 651.

The capacitor C34A is formed of the conductor layers 623 and 653, and the dielectric layer 64 interposed between the conductor layers 642 and 653. The capacitor C34B is formed of the conductor layers 643 and 654, and the dielectric layer 64 interposed between the conductor layers 643 and 654.

Next, structural features of the band-pass filter 101 will be described with reference to FIG. 24. In the present embodiment, the distance between the second resonator 22 and the third resonator 23 is shorter than that between the first resonator 21 and the second resonator 22, and is also shorter than that between the third resonator 23 and the fourth resonator 24. In the present embodiment, the distance between the second resonator 22 and the third resonator 23 is longer than that between the second resonator 22 and the third resonator 23 in the first embodiment (refer to FIG. 4).

As shown in FIG. 30A, the resonator-forming conductor layer 771 formed in the dielectric layer 77 and the resonator-forming conductor layer 771 formed in the dielectric layer 78 are located so as to overlap each other when viewed from the Z direction. As shown in FIGS. 31A and 31B the resonator-forming conductor layer 811 formed in the dielectric layer 81 and the resonator-forming conductor layer 821 formed in the dielectric layer 82 are located so as to overlap each other when viewed from the Z direction. As shown in FIGS. 32A and 32B, the resonator-forming conductor layer 832 formed in the dielectric layer 83 and the resonator-forming conductor layer 842 formed in the dielectric layer 84 are located so as to overlap each other when viewed from the Z direction. The resonator-forming conductor layer 833 formed in the dielectric layer 83 and the resonator-forming conductor layer 843 formed in the dielectric layer 84 are located so as to overlap each other when viewed from the Z direction.

The operation and effects of the band-pass filter 101 according to the first embodiment will now be described. In the present embodiment, just as with the first embodiment, an attenuation pole at which insertion loss abruptly varies is formed in each of a first vicinity range that is a frequency range lower than a pass band and in the vicinity of the pass band and a second vicinity range that is a frequency range higher than the pass band and in the vicinity of the pass band.

Specifically in the present embodiment, since the distance between the second resonator 22 and the third resonator 23 is made longer than that of the first embodiment, the capacitive coupling between the second resonator 22 and the third resonator 23 is weakened as compared to the case of the first embodiment while the magnetic coupling between the second resonator 22 and the third resonator 23 is weakened as compared to the case of the first embodiment. To be more specific, by providing no capacitor C23B, the capacitive coupling between the second resonator 22 and the third resonator 23 is weakened. The capacitive coupling between the second resonator 22 and the third resonator 23 is adjusted by the capacitor C23A. On the other hand, in the first embodiment, the capacitive coupling between the second resonator 22 and the third resonator 23 is adjusted by the capacitors C23A and C23B. According to the present embodiment, as compared to the first embodiment, the capacitive coupling between the second resonator 22 and the third resonator 23 is easily adjusted.

Next, examples of characteristics of the band-pass filter 101 according to the present embodiment will be described with reference to FIGS. 33 to 38. Here, the examples of characteristics of the band-pass filter 101 that is designed such that the pass band includes a frequency band of 4.7 GHz to 5.1 GHz will be described.

Figure 33:
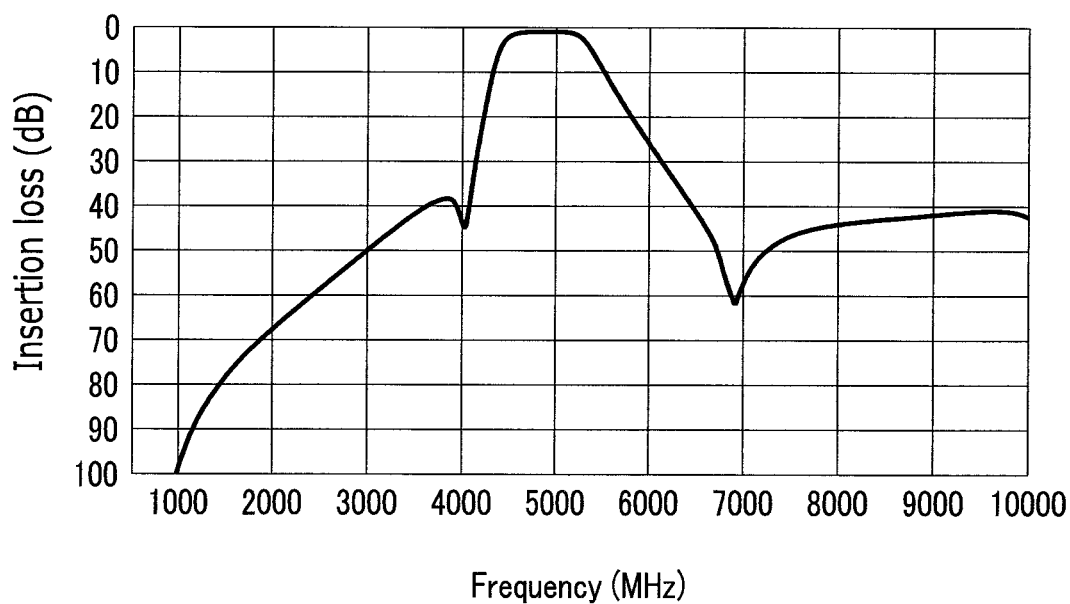
FIG. 33 is a characteristic diagram showing an example of pass characteristic of the band-pass filter according to the second embodiment of the invention.
Figure 34:
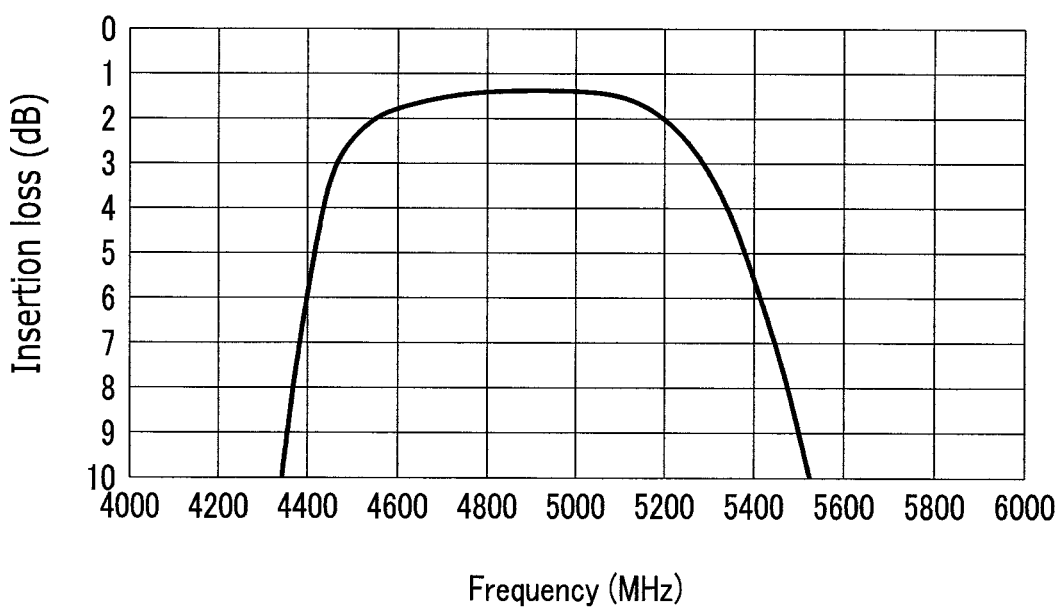
FIG. 34 is a characteristic diagram showing a portion of FIG. 33 on an enlarged scale.

FIG. 33 shows an example of pass characteristic of the band-pass filter 1, FIG. 34 shows part of FIG. 33 on an enlarged scale. Here, the insertion loss when an unbalanced signal was inputted to the unbalanced port 11 is indicated as the pass characteristic of the band-pass filter 101. In each of FIGS. 33 and 34, the horizontal axis represents frequency, and the vertical axis represents insertion loss. It is found from FIG. 33 that in the band-pass filter 101, an attenuation pole at which the insertion loss abruptly varies is formed in each of first and second vicinity ranges.

By comparison between FIG. 33 and FIG. 17, which shows an example of pass characteristic of the band-pass filter 1 according to the first embodiment, the following difference can be seen. In the band-pass filter 101, the attenuation pole formed in the higher-side frequency range is far from the pass band, as compared to the case of the band-pass filter 1. This is because of weakening of the capacitive coupling between the second resonator 22 and the third resonator 23 by the capacitors C23A and C23B as compared to the capacitive coupling of the band-pass filter 1, with weakening of the magnetic coupling between the second resonator 22 and the third resonator 23 as compared to the magnetic coupling of the band-pass filter 1, by making the distance between the second resonator 22 and the third resonator 23 longer in the band-pass filter 101 than in the band-pass filter 1. In other words, as can be seen from FIGS. 17 and 33, strengthening of the capacitive coupling between the second resonator 22 and the third resonator 23 with strengthening of the magnetic coupling between the second resonator 22 and the third resonator 23, by making the distance between the second resonator 22 and the third resonator 23 shorter, allows the frequency of the attenuation pole formed in the second vicinity range to get closer to the pass band.

The insertion loss is preferably 3.0 dB or less. As shown in FIG. 34, the band-pass filter 101 has the insertion loss of 3.0 dB or less in the foregoing frequency bands.

Figure 35:
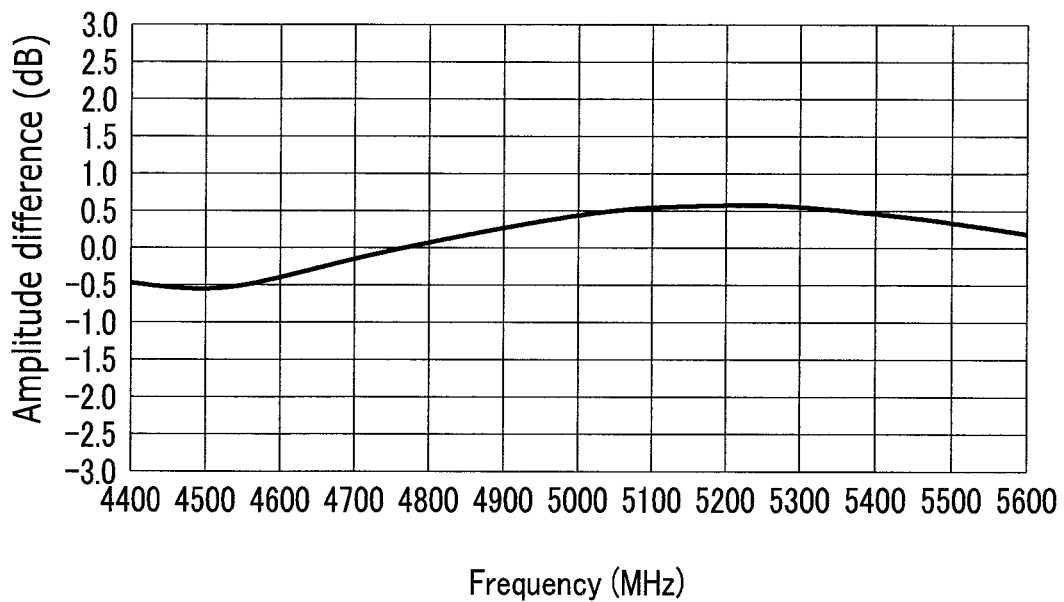
FIG. 35 is a characteristic diagram showing an example of amplitude balance characteristic of the band-pass filter according to the second embodiment of the invention.

FIG. 35 shows an example of amplitude balance characteristic of the band-pass filter 101. Here, the amplitude balance characteristic of the band-pass filter 101 is represented by using an amplitude difference, just as with FIG. 19 of the first embodiment. In FIG. 35, the horizontal axis represents frequency, and the vertical axis represents amplitude difference. With the amplitude difference denoted as m (dB), m preferably has a value of −1.5 or more and not more than 1.5, and more preferably −1.0 or more and not more than 1.0. As shown in FIG. 35, the band-pass filter 101 has an m value of −1.0 or more and not more than 1.0 in the foregoing frequency band.

Figure 36:
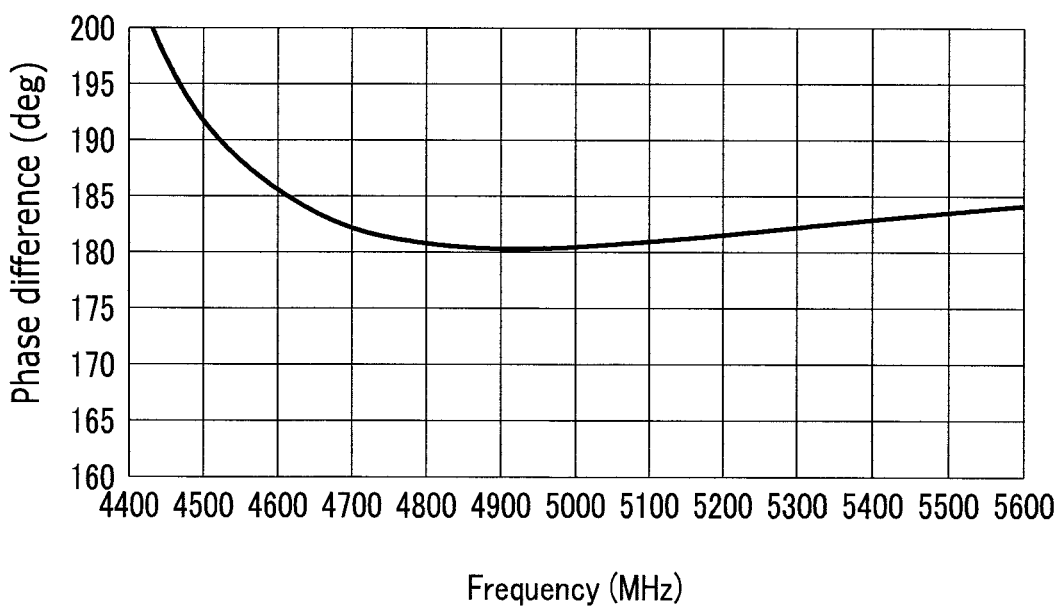
FIG. 36 is a characteristic diagram showing an example of phase balance characteristic of the band-pass filter according to the second embodiment of the invention.

FIG. 36 shows an example of phase balance characteristic of the band-pass filter 101. Here, the phase balance characteristic of the band-pass filter 101 is represented by using a phase difference, just as with FIG. 20 of the first embodiment. In FIG. 36, the horizontal axis represents frequency, and the vertical axis represents phase difference. With the phase difference denoted as p (deg), p preferably has a value of 165 or more and not more than 196. As shown in FIG. 35, the band-pass filter 101 has a p value of 165 or more and not more than 195 in the foregoing frequency band.

Figure 37:
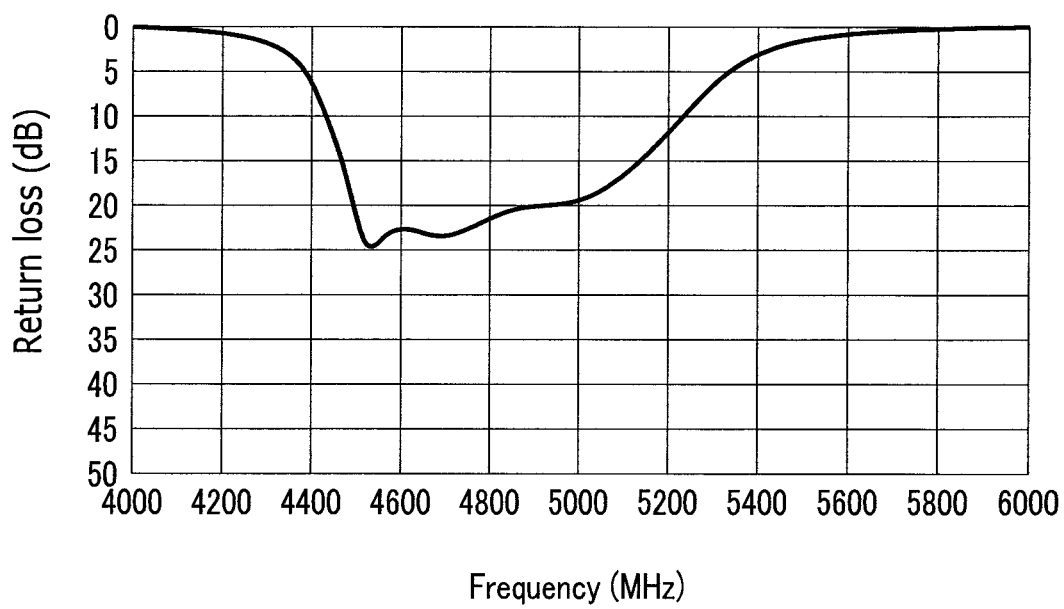
FIG. 37 is a characteristic diagram showing an example of reflection characteristic of the unbalanced port of the band-pass filter according to the second embodiment of the invention.
Figure 38:
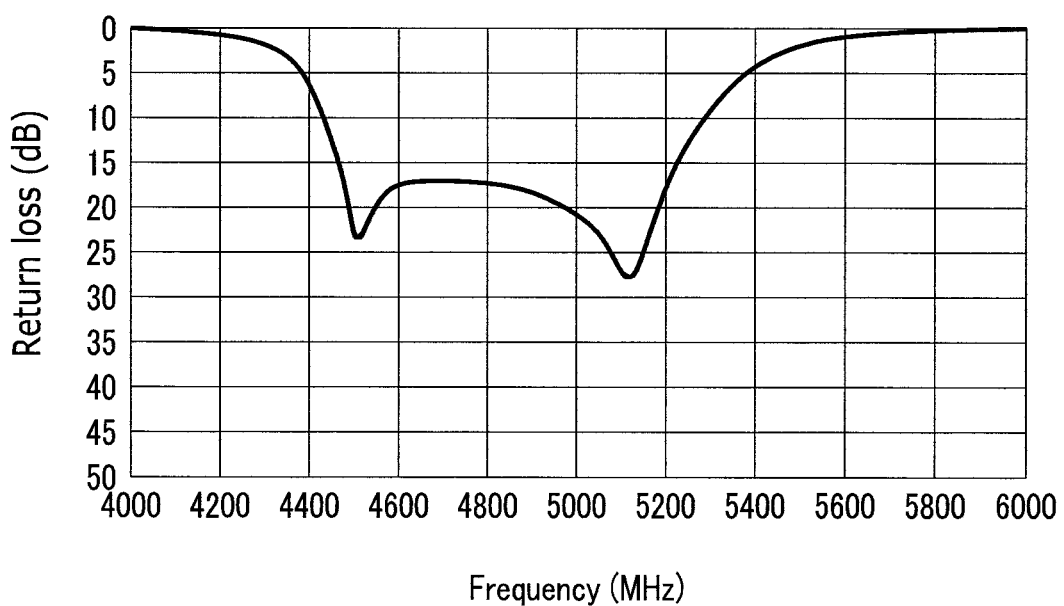
FIG. 38 is a characteristic diagram showing an example of pass characteristic of the first and second balanced ports of the band-pass filter according to the second embodiment of the invention.

FIG. 37 shows an example of reflection characteristic of the unbalanced port 11 of the band-pass filter 101. FIG. 38 shows an example of reflection characteristic of the first and second balanced ports 12 and 13 of the band-pass filter 101. In each of FIGS. 37 and 38, the horizontal axis represents frequency, and the vertical axis represents return loss. The return loss is preferably 10 dB or more. As shown in FIGS. 37 and 38, the band-pass filter 101 has the return loss of 10 dB or more in the foregoing frequency band.

As described above, the band-pass filter 101 having the characteristics shown in FIGS. 33 to 38 is usable in at least the frequency band of 4.7 GHz to 5.1 GHz, and has the favorable balance characteristics in this frequency band. As is understood from FIGS. 33 to 38, the band-pass filter 101 can form the abrupt attenuation pole in each of the first and second vicinity ranges while satisfying the balance characteristics.

The configuration, function and effects of the present embodiment are otherwise the same as those of the first embodiment.

Third Embodiment

Figure 39:
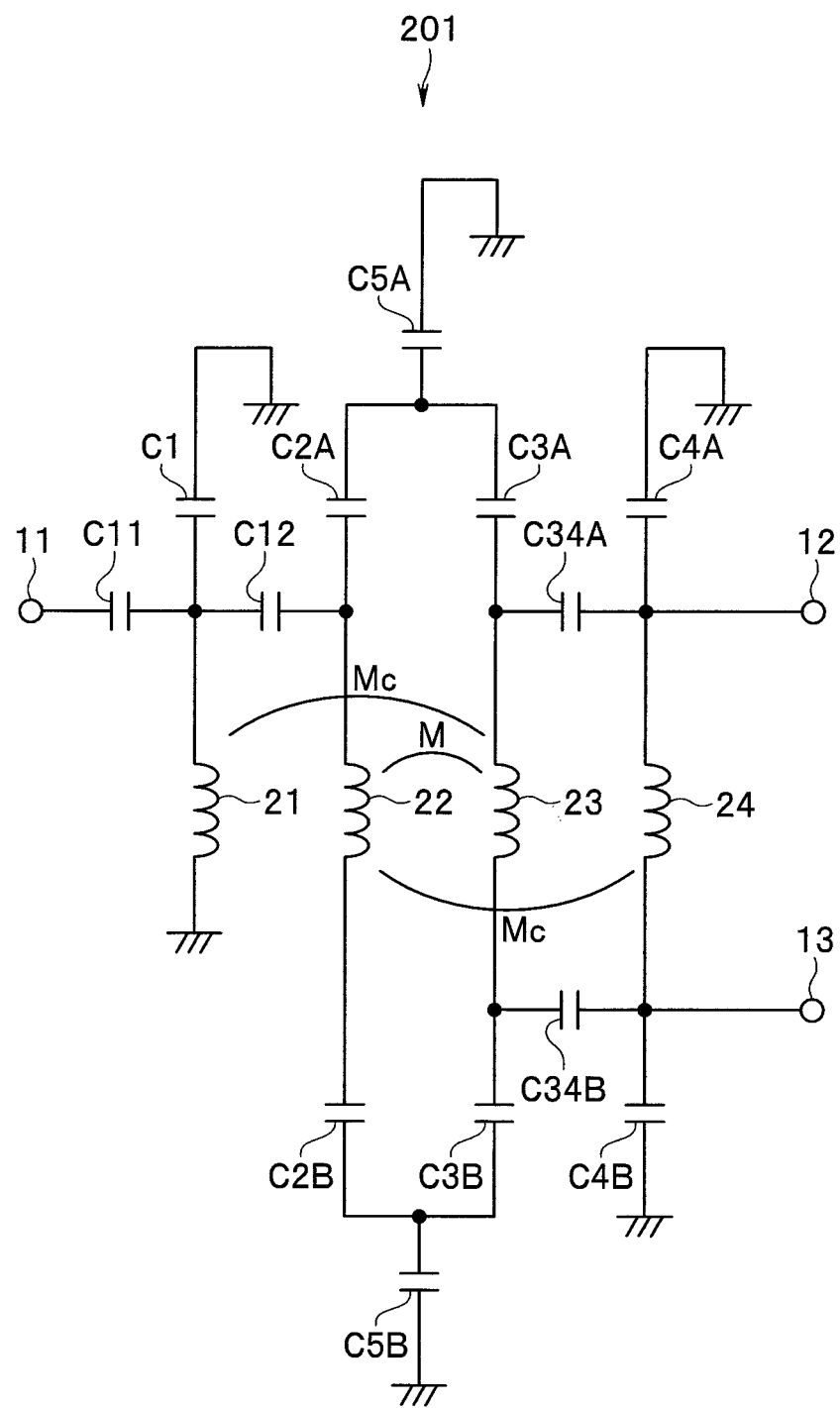
FIG. 39 is a circuit diagram showing the circuit configuration of a band-pass filter according to a third embodiment of the invention.

A third embodiment of the invention will now be described. First, the circuit configuration of a band-pass filter according to the present embodiment will be described in brief with reference to FIG. 39. FIG. 39 shows the circuit configuration of the band-pass filter according to the present embodiment.

The circuit configuration of a band-pass filter 201 according to the present embodiment is different from that of the band-pass filter 101 according to the second embodiment in the following respect. In the present embodiment, there is no capacitor C23A provided for connecting one end of the second resonator 22 on the side of the capacitor C2A to one end of the third resonator 23 on the side of the capacitor C3A.

The band-pass filter 201 includes capacitors C5A and C5B. Each of the capacitors C5A and C5B has a first end and a second end. The first end of the capacitor C5A is connected to the capacitors C2A and C3A. The second end of the capacitor C5A is connected to the ground.

The first end of the capacitor C5B is connected to the capacitors C2B and C3B. The second end of the capacitor C5B is connected to the ground.

The other circuit configuration of the band-pass filter 201 is the same as that of the band-pass filter 101 according to the second embodiment.

In the present embodiment, each of a group of the capacitors C2A, C3A, and C5A and a group of the capacitors C2B, C3B, and C5B are connected in so-called. Y-shaped connection. Therefore, according to the present embodiment, it is possible to reduce the capacitance of each of the capacitors C2A, C2B, C3A, C5B, C5A, and C5B, as compared with a case where these groups are connected in so-called π-shaped connection or Δ-shaped connection. As a result, the present embodiment allows downsizing of the band-pass filter 201.

The configuration, function and effects of the present embodiment are otherwise the same as those of the second embodiment.

The present invention is not limited to the foregoing embodiments, and various modifications may be made thereto. For example, the band-pass filter according to the present invention may be integrated with another circuit into a stack electronic component. Examples of the other circuits include a branch circuit, a filter, and a matching circuit.

Obviously, many modifications and variations of the present invention a possible in the light of the above teachings. Thus, it is to be understood that, within the scope of the appended claims and equivalents thereof, the invention may be practiced in other embodiments than the foregoing most preferable embodiments.

What is claimed is:

1. A band-pass filter comprising:
    an unbalanced port;
    a first balanced port;
    a second balanced port;
    a first resonator provided between the unbalanced port and the first and second balanced ports in a circuit configuration;
    a second resonator provided between the first resonator and the first and second balanced ports in the circuit configuration;
    a first capacitor connecting one end of the first resonator to a ground;
    a second capacitor connecting one end of the second resonator to the ground; and
    a third capacitor connecting another end of the second resonator to the ground,
wherein
    the first resonator is jump-coupled to the second resonator by magnetic coupling.

2. The band-pass filter according to claim 1 further comprising a stack including a plurality of stacked dielectric layers, a plurality of stacked conductor layers, and a plurality of through holes, wherein
 the plurality of conductor layers include a plurality of resonator-forming conductor layers,
 the plurality of through holes include a plurality of resonator-forming through holes,
 the second resonator includes a first through hole line, a second through hole line, and a conductor layer portion,
 each of the first and second through hole lines is formed of serially connected two or more through holes of the plurality of resonator-forming through holes, and penetrates two or more dielectric layers of the plurality of dielectric layers, and
 the conductor layer portion is formed of one or more resonator-forming conductor layers of the plurality of resonator-forming conductor layers, and connects one end of the first through hole line to one end of the second through hole line.

3. The band-pass filter according to claim 1 further comprising a third resonator provided between the first resonator and the second resonator in the circuit configuration.

4. The band-pass filter according to claim 3, wherein the first resonator and the third resonator are capacitively coupled through a capacitor.

5. The band-pass filter according to claim 3 further comprising:
 a fourth capacitor connecting one end of the third resonator to the ground; and
 a fifth capacitor connecting another end of the third resonator to the ground.

6. The band-pass filter according to claim 5 further comprising a sixth capacitor connecting each one end of the second and fourth capacitors to the ground.

7. The band-pass filter according to claim 3, wherein a distance between the second resonator and the third resonator is shorter than a distance between the first resonator and the third resonator.

8. The band-pass filter according to claim 3 further comprising a fourth resonator provided between the second resonator and the first and second balanced ports in the circuit configuration, wherein
 the fourth resonator is jump-coupled to the third resonator.

9. The band-pass filter according to claim 8 further comprising:
 a fourth capacitor connecting one end of the third resonator to the ground;
 a fifth capacitor connecting another end of the third resonator to the ground;
 a seventh capacitor connecting one end of the fourth resonator to the ground; and
 an eighth capacitor connecting another end of the fourth resonator to the ground, wherein another end of the first resonator is connected to the ground.

10. The band-pass filter according to claim 8, wherein a distance between the second resonator and the third resonator is shorter than a distance between the first resonator and the third resonator, and shorter than a distance between the second resonator and the fourth resonator.

11. A band-pass filter comprising:
 an unbalanced port;
 a first balanced port;
 a second balanced port;
 a first resonator provided between the unbalanced port and the first and second balanced ports in a circuit configuration;
 a second resonator provided between the first resonator and the first and second balanced ports in the circuit configuration;
 a third resonator provided between the first resonator and the second resonator in the circuit configuration;
 a first capacitor connecting one end of the first resonator to a ground;
 a second capacitor connecting one end of the second resonator to the ground; and
 a third capacitor connecting another end of the second resonator to the ground, wherein
 a distance between the second resonator and the third resonator is shorter than a distance between the first resonator and the third resonator.

12. A band-pass filter comprising:
 an unbalanced port;
 a first balanced port;
 a second balanced port;
 a first resonator provided between the unbalanced port and the first and second balanced ports in a circuit configuration;
 a second resonator provided between the first resonator and the first and second balanced ports in the circuit configuration;
 a third resonator provided between the first resonator and the second resonator in the circuit configuration;
 a fourth resonator provided between the second resonator and the first and second balanced ports in the circuit configuration;
 a first capacitor connecting one end of the first resonator to a ground;
 a second capacitor connecting one end of the second resonator to the ground; and
 a third capacitor connecting another end of the second resonator to the ground, wherein
 the fourth resonator is jump-coupled to the third resonator.

13. The band-pass filter according to claim 12, wherein the jump-coupling is by magnetic coupling.

* * * * *